(12) United States Patent
Devlin et al.

(10) Patent No.: US 11,978,752 B2
(45) Date of Patent: May 7, 2024

(54) APERTURE-METASURFACE AND HYBRID REFRACTIVE-METASURFACE IMAGING SYSTEMS

(71) Applicant: Metalenz, Inc., Boston, MA (US)

(72) Inventors: Robert C. Devlin, Stoneham, MA (US); John Graff, Swampscott, MA (US)

(73) Assignee: Metalenz, Inc., Boston, MA (US)

( * ) Notice: Subject to any disclaimer, the term of this patent is extended or adjusted under 35 U.S.C. 154(b) by 360 days.

(21) Appl. No.: 16/938,823

(22) Filed: Jul. 24, 2020

(65) Prior Publication Data

US 2021/0028215 A1 Jan. 28, 2021

Related U.S. Application Data

(60) Provisional application No. 62/878,962, filed on Jul. 26, 2019.

(51) Int. Cl.
*H01L 27/146* (2006.01)
*G02B 1/00* (2006.01)
(Continued)

(52) U.S. Cl.
CPC ........ *H01L 27/14625* (2013.01); *G02B 1/002* (2013.01); *G02B 5/1809* (2013.01);
(Continued)

(58) Field of Classification Search
CPC ...... G02B 1/002; G02B 1/041; G02B 5/1809; G02B 5/1814; G02B 5/1842; G02B 5/1866; G02B 5/1871; G02B 5/203; G02B 27/0944; G02B 27/0988; G02B 27/4233; G02B 27/4244; G02B 27/4294; H01L 27/146; H01L 27/14625; H01L 27/14618; H01L 27/14621; H04N 5/2254
(Continued)

(56) References Cited

U.S. PATENT DOCUMENTS 3,877,034 A 4/1975 Nelson
4,777,116 A 10/1988 Kawatsuki et al.
(Continued)

FOREIGN PATENT DOCUMENTS

CA 3006173 A1 6/2017
CA 3020261 A1 10/2017
(Continued)

OTHER PUBLICATIONS

International Search Report and Written Opinion for International Application No. PCT/US2018/031204, Search completed Jun. 29, 2018, dated Jul. 23, 2018, 14 pgs.
(Continued)

*Primary Examiner* — Stephone B Allen
*Assistant Examiner* — Jyotsna V Dabbi

(57) ABSTRACT

Hybrid imaging systems incorporating conventional optical elements and metasurface elements with light sources and/or detectors, and methods of the manufacture and operation of such optical arrangements are provided. Systems and methods describe the integration of apertures with metasurface elements and refractive optics with metasurface elements in illumination sources and sensors.

12 Claims, 20 Drawing Sheets

(51) Int. Cl.
    *G02B 5/18*          (2006.01)
    *G02B 27/09*        (2006.01)
    *G02B 27/42*        (2006.01)
    *H04N 23/55*       (2023.01)

(52) U.S. Cl.
    CPC ....... *G02B 5/1814* (2013.01); *G02B 27/0944* (2013.01); *G02B 27/0988* (2013.01); *G02B 27/4233* (2013.01); *G02B 27/4244* (2013.01); *G02B 27/4294* (2013.01); *H01L 27/14618* (2013.01); *H01L 27/14621* (2013.01); *H04N 23/55* (2023.01)

(58) Field of Classification Search
    USPC ........................................................ 359/558
    See application file for complete search history.

(56) References Cited

U.S. PATENT DOCUMENTS

| | | | |
|---|---|---|---|
| 4,856,899 A | 8/1989 | Iwaoka et al. |
| 5,085,496 A | 2/1992 | Yoshida et al. |
| 5,337,146 A | 8/1994 | Azzam |
| 5,452,126 A | 9/1995 | Johnson |
| 5,620,792 A | 4/1997 | Challener, IV |
| 6,097,856 A | 8/2000 | Hammond, Jr. |
| 6,669,803 B1 | 12/2003 | Kathman et al. |
| 6,731,839 B2 | 5/2004 | Bhagavatula et al. |
| 6,825,986 B2 | 11/2004 | Ashkinazy et al. |
| 6,834,027 B1 | 12/2004 | Sakaguchi et al. |
| 6,924,457 B2 | 8/2005 | Koyama et al. |
| 6,927,922 B2 | 8/2005 | George et al. |
| 7,057,151 B2 | 6/2006 | Lezec et al. |
| 7,061,612 B2 | 6/2006 | Johnston |
| 7,061,693 B2 | 6/2006 | Zalevsky |
| 7,171,078 B2 | 1/2007 | Sasaki et al. |
| 7,171,084 B2 | 1/2007 | Izumi et al. |
| 7,186,969 B2 | 3/2007 | Altendorf et al. |
| 7,241,988 B2 | 7/2007 | Gruber et al. |
| 7,324,210 B2 | 1/2008 | De Groot et al. |
| 7,327,468 B2 | 2/2008 | Maznev et al. |
| 7,402,131 B2 | 7/2008 | Mueth et al. |
| 7,450,618 B2 | 11/2008 | Dantus et al. |
| 7,547,874 B2 | 6/2009 | Liang |
| 7,561,264 B2 | 7/2009 | Treado et al. |
| 7,576,899 B2 | 8/2009 | Kanesaka et al. |
| 7,679,830 B2 | 3/2010 | Dowski, Jr. |
| 7,684,097 B2 | 3/2010 | Fukumoto et al. |
| 7,773,307 B2 | 8/2010 | Shih |
| 7,800,683 B2 | 9/2010 | Zalevsky et al. |
| 7,812,295 B2 | 10/2010 | Zalevsky et al. |
| 7,928,900 B2 | 4/2011 | Fuller et al. |
| 7,929,220 B2 | 4/2011 | Sayag |
| 7,965,607 B2 | 6/2011 | Fukumoto et al. |
| 8,009,358 B2 | 8/2011 | Zalevsky et al. |
| 8,040,604 B2 | 10/2011 | Zalevsky et al. |
| 8,107,705 B2 | 1/2012 | Dowski, Jr. et al. |
| 8,152,307 B2 | 4/2012 | Duelli et al. |
| 8,169,703 B1 | 5/2012 | Mossberg et al. |
| 8,192,022 B2 | 6/2012 | Zalevsky |
| 8,212,866 B2 | 7/2012 | Lemmer et al. |
| 8,318,386 B2 | 11/2012 | Kobrin |
| 8,328,396 B2 | 12/2012 | Capasso et al. |
| 8,351,048 B2 | 1/2013 | Millerd |
| 8,351,120 B2 | 1/2013 | Deng et al. |
| 8,390,932 B2 | 3/2013 | Jia et al. |
| 8,400,494 B2 | 3/2013 | Zalevsky et al. |
| 8,430,513 B2 | 4/2013 | Chang et al. |
| 8,451,368 B2 | 5/2013 | Sung et al. |
| 8,472,797 B2 | 6/2013 | Ok et al. |
| 8,481,948 B2 | 7/2013 | Frach et al. |
| 8,558,873 B2 | 10/2013 | Mceldowney |
| 8,587,474 B2 | 11/2013 | Fuller et al. |
| 8,649,631 B2 | 2/2014 | Islam et al. |
| 8,687,040 B2 | 4/2014 | Silveira |
| 8,716,677 B2 | 5/2014 | Cui |
| 8,734,033 B2 | 5/2014 | Walters et al. |
| 8,743,923 B2 | 6/2014 | Geske et al. |
| 8,816,460 B2 | 8/2014 | Kalevo et al. |
| 8,848,273 B2 | 9/2014 | Yu et al. |
| 8,876,289 B2 | 11/2014 | Dorronsoro et al. |
| 8,908,149 B2 | 12/2014 | Freimann |
| 8,912,973 B2 | 12/2014 | Werner et al. |
| 9,007,451 B2 | 4/2015 | Rogers et al. |
| 9,116,302 B2 | 8/2015 | Mccarthy et al. |
| 9,151,891 B2 | 10/2015 | Ma et al. |
| 9,212,899 B2 | 12/2015 | Johnson et al. |
| 9,298,060 B2 | 3/2016 | Shen et al. |
| 9,309,274 B2 | 4/2016 | Van Der Boom et al. |
| 9,310,535 B1 | 4/2016 | Greiner et al. |
| 9,329,484 B1 | 5/2016 | Markle et al. |
| 9,330,704 B2 | 5/2016 | Nishimura et al. |
| 9,367,036 B2 | 6/2016 | Pyun et al. |
| 9,369,621 B2 | 6/2016 | Malone et al. |
| 9,391,700 B1 | 7/2016 | Bruce et al. |
| 9,392,153 B2 | 7/2016 | Myhre et al. |
| 9,411,103 B2 | 8/2016 | Astratov |
| 9,482,796 B2 | 11/2016 | Arbabi et al. |
| 9,500,771 B2 | 11/2016 | Liu et al. |
| 9,536,362 B2 | 1/2017 | Sarwar et al. |
| 9,553,423 B2 | 1/2017 | Chen et al. |
| 9,557,585 B1 | 1/2017 | Yap et al. |
| 9,606,415 B2 | 3/2017 | Zheludev et al. |
| 9,609,190 B2 | 3/2017 | Lee et al. |
| 9,739,918 B2 | 8/2017 | Arbabi et al. |
| 9,766,463 B2 | 9/2017 | Border et al. |
| 9,778,404 B2 | 10/2017 | Divliansky et al. |
| 9,825,074 B2 | 11/2017 | Tian et al. |
| 9,829,700 B2 | 11/2017 | Parent et al. |
| 9,835,870 B2 | 12/2017 | Astratov et al. |
| 9,836,122 B2 | 12/2017 | Border |
| 9,869,580 B2 | 1/2018 | Grossinger et al. |
| 9,880,377 B1 | 1/2018 | Safrani et al. |
| 9,885,859 B2 | 2/2018 | Harris |
| 9,891,393 B2 | 2/2018 | Reece |
| 9,939,129 B2 | 4/2018 | Byrnes et al. |
| 9,947,118 B2 | 4/2018 | Khare et al. |
| 9,952,096 B2 | 4/2018 | Kats et al. |
| 9,958,251 B1 | 5/2018 | Brock et al. |
| 9,967,541 B2 | 5/2018 | Piestun |
| 9,978,801 B2 | 5/2018 | Park et al. |
| 9,989,680 B2 | 6/2018 | Arbabi et al. |
| 9,992,474 B2 | 6/2018 | Grunnet-jepsen et al. |
| 9,995,859 B2 | 6/2018 | Kamali et al. |
| 9,995,930 B2 | 6/2018 | Arbabi et al. |
| 10,007,118 B2 | 6/2018 | Border |
| 10,054,859 B2 | 8/2018 | Ye et al. |
| 10,084,239 B2 | 9/2018 | Shaver et al. |
| 10,108,085 B2 | 10/2018 | Peters et al. |
| 10,126,466 B2 | 11/2018 | Lin et al. |
| 10,132,465 B2 | 11/2018 | Byrnes et al. |
| 10,149,612 B2 | 12/2018 | Muyo et al. |
| 10,234,383 B2 | 3/2019 | Wang et al. |
| 10,254,454 B2 | 4/2019 | Klug et al. |
| 10,267,957 B2 | 4/2019 | Kamali et al. |
| 10,310,148 B2 | 6/2019 | Stewart et al. |
| 10,310,387 B2 | 6/2019 | Palmer et al. |
| 10,315,951 B2 | 6/2019 | Toussaint et al. |
| 10,317,667 B2 | 6/2019 | Waller et al. |
| 10,324,314 B2 | 6/2019 | Czaplewski et al. |
| 10,338,275 B1 | 7/2019 | Acosta et al. |
| 10,341,640 B2 | 7/2019 | Shechtman et al. |
| 10,345,246 B2 | 7/2019 | Tian et al. |
| 10,345,519 B1 | 7/2019 | Miller et al. |
| 10,365,416 B2 | 7/2019 | Zhan et al. |
| 10,371,936 B2 | 8/2019 | Didomenico |
| 10,386,620 B2 | 8/2019 | Astratov et al. |
| 10,388,805 B2 | 8/2019 | Engel et al. |
| 10,402,993 B2 | 9/2019 | Han et al. |
| 10,408,416 B2 | 9/2019 | Khorasaninejad et al. |
| 10,408,419 B2 | 9/2019 | Aieta et al. |
| 10,416,565 B2 | 9/2019 | Ahmed et al. |
| 10,435,814 B2 | 10/2019 | Plummer et al. |
| 10,440,244 B2 | 10/2019 | Rosenblatt et al. |

(56) References Cited

U.S. PATENT DOCUMENTS

| | | |
|---|---|---|
| 10,440,300 B2 | 10/2019 | Rephaeli et al. |
| 10,466,394 B2 | 11/2019 | Lin et al. |
| 10,468,447 B2 | 11/2019 | Akselrod et al. |
| 10,514,296 B2 | 12/2019 | Han et al. |
| 10,527,832 B2 | 1/2020 | Schwab et al. |
| 10,527,851 B2 | 1/2020 | Lin et al. |
| 10,536,688 B2 | 1/2020 | Haas et al. |
| 10,539,723 B2 | 1/2020 | Iazikov et al. |
| 10,545,323 B2 | 1/2020 | Schwab et al. |
| 10,591,643 B2 | 3/2020 | Lin et al. |
| 10,670,782 B2 | 6/2020 | Arbabi et al. |
| 10,795,168 B2 | 10/2020 | Riley, Jr. et al. |
| 10,816,704 B2 | 10/2020 | Arbabi et al. |
| 10,915,737 B2 | 2/2021 | Hu et al. |
| 11,231,544 B2 | 1/2022 | Lin et al. |
| 11,298,052 B2 | 4/2022 | Palikaras et al. |
| 11,353,626 B2 | 6/2022 | You et al. |
| 11,385,104 B2 | 7/2022 | Yao et al. |
| 11,385,516 B2 | 7/2022 | Didomenico |
| 11,579,456 B2 | 2/2023 | Riley et al. |
| 11,835,680 B2 | 12/2023 | Groever et al. |
| 11,835,681 B2 | 12/2023 | Lin et al. |
| 11,867,937 B2 | 1/2024 | Rubin et al. |
| 2002/0048727 A1 | 4/2002 | Zhou et al. |
| 2002/0118903 A1 | 8/2002 | Cottrell et al. |
| 2002/0181126 A1 | 12/2002 | Nishioka |
| 2003/0107787 A1 | 6/2003 | Bablumyan |
| 2004/0173738 A1 | 9/2004 | Mizuno |
| 2004/0190116 A1 | 9/2004 | Lezec et al. |
| 2004/0258128 A1 | 12/2004 | Johs et al. |
| 2005/0151698 A1 | 7/2005 | Mohamadi |
| 2005/0161589 A1 | 7/2005 | Kim et al. |
| 2005/0211665 A1 | 9/2005 | Gao et al. |
| 2005/0220162 A1 | 10/2005 | Nakamura |
| 2005/0239003 A1 | 10/2005 | Chiodini et al. |
| 2006/0042322 A1 | 3/2006 | Mendoza et al. |
| 2007/0026585 A1 | 2/2007 | Wong et al. |
| 2007/0273957 A1 | 11/2007 | Zalevsky et al. |
| 2009/0135086 A1 | 5/2009 | Fuller et al. |
| 2009/0230333 A1 | 9/2009 | Eleftheriades |
| 2009/0296223 A1 | 12/2009 | Werner et al. |
| 2010/0033701 A1 | 2/2010 | Lee et al. |
| 2010/0091224 A1 | 4/2010 | Cho et al. |
| 2010/0110430 A1 | 5/2010 | Ebbesen et al. |
| 2010/0110433 A1 | 5/2010 | Nedelcu et al. |
| 2010/0134869 A1 | 6/2010 | Bernet et al. |
| 2010/0177164 A1 | 7/2010 | Zalevsky et al. |
| 2010/0226134 A1 | 9/2010 | Capasso et al. |
| 2010/0232017 A1 | 9/2010 | Mccarthy et al. |
| 2010/0255428 A1 | 10/2010 | Chen et al. |
| 2010/0259804 A1 | 10/2010 | Buschbeck et al. |
| 2011/0012807 A1 | 1/2011 | Sorvala |
| 2011/0019180 A1 | 1/2011 | Kruglick |
| 2011/0102877 A1 | 5/2011 | Parriaux |
| 2011/0187577 A1 | 8/2011 | Fuller et al. |
| 2011/0261441 A1 | 10/2011 | Zheludev et al. |
| 2012/0008133 A1 | 1/2012 | Silny et al. |
| 2012/0068347 A1 | 3/2012 | Isobayashi et al. |
| 2012/0140235 A1 | 6/2012 | Lee et al. |
| 2012/0258407 A1 | 10/2012 | Sirat |
| 2012/0293854 A1 | 11/2012 | Zheludev et al. |
| 2012/0327666 A1 | 12/2012 | Liu et al. |
| 2012/0328240 A1 | 12/2012 | Ma et al. |
| 2013/0016030 A1 | 1/2013 | Liu et al. |
| 2013/0037873 A1 | 2/2013 | Suzuki et al. |
| 2013/0050285 A1 | 2/2013 | Takahashi et al. |
| 2013/0058071 A1 | 3/2013 | Ben Moshe |
| 2013/0194787 A1 | 8/2013 | Geske et al. |
| 2013/0208332 A1 | 8/2013 | Yu et al. |
| 2014/0043846 A1 | 2/2014 | Yang et al. |
| 2015/0018500 A1 | 1/2015 | Gerber et al. |
| 2015/0055745 A1 | 2/2015 | Holzner et al. |
| 2015/0092139 A1 | 4/2015 | Eguchi |
| 2015/0098002 A1 | 4/2015 | Wang |
| 2015/0116721 A1 | 4/2015 | Kats et al. |
| 2015/0219806 A1* | 8/2015 | Arbabi ............... G02B 5/1842 29/436 |
| 2015/0241608 A1 | 8/2015 | Shian et al. |
| 2015/0316717 A1 | 11/2015 | Astratov |
| 2016/0025914 A1 | 1/2016 | Brongersma et al. |
| 2016/0037146 A1 | 2/2016 | Mcgrew |
| 2016/0077261 A1 | 3/2016 | Arbabi et al. |
| 2016/0133762 A1* | 5/2016 | Blasco Claret ...... H04N 25/134 438/69 |
| 2016/0161826 A1 | 6/2016 | Shen et al. |
| 2016/0195705 A1 | 7/2016 | Betzig et al. |
| 2016/0253551 A1 | 9/2016 | Pezzaniti et al. |
| 2016/0254638 A1 | 9/2016 | Chen et al. |
| 2016/0276979 A1 | 9/2016 | Shaver et al. |
| 2016/0299337 A1 | 10/2016 | Arbabi et al. |
| 2016/0299426 A1 | 10/2016 | Gates et al. |
| 2016/0306079 A1 | 10/2016 | Arbabi et al. |
| 2016/0306157 A1 | 10/2016 | Rho et al. |
| 2016/0318067 A1 | 11/2016 | Banerjee et al. |
| 2016/0331457 A1 | 11/2016 | Varghese et al. |
| 2016/0341859 A1 | 11/2016 | Shvets et al. |
| 2016/0359235 A1 | 12/2016 | Driscoll et al. |
| 2016/0361002 A1 | 12/2016 | Palikaras et al. |
| 2016/0370568 A1 | 12/2016 | Toussaint et al. |
| 2017/0003169 A1* | 1/2017 | Shaltout ............... G02B 1/002 |
| 2017/0010466 A1 | 1/2017 | Klug et al. |
| 2017/0030773 A1 | 2/2017 | Han et al. |
| 2017/0038574 A1 | 2/2017 | Zhuang et al. |
| 2017/0045652 A1 | 2/2017 | Arbabi et al. |
| 2017/0082263 A1 | 3/2017 | Byrnes et al. |
| 2017/0090221 A1 | 3/2017 | Atwater |
| 2017/0121843 A1 | 5/2017 | Plummer et al. |
| 2017/0125911 A1 | 5/2017 | Alu et al. |
| 2017/0131460 A1 | 5/2017 | Lin et al. |
| 2017/0146806 A1 | 5/2017 | Lin et al. |
| 2017/0176758 A1 | 6/2017 | Lerner et al. |
| 2017/0186166 A1 | 6/2017 | Grunnet-Jepsen et al. |
| 2017/0201658 A1 | 7/2017 | Rosenblatt et al. |
| 2017/0212285 A1 | 7/2017 | Arbabi et al. |
| 2017/0235162 A1 | 8/2017 | Shaltout et al. |
| 2017/0250577 A1 | 8/2017 | Ho et al. |
| 2017/0293141 A1 | 10/2017 | Schowengerdt et al. |
| 2017/0299784 A1 | 10/2017 | Mikkelsen et al. |
| 2017/0310907 A1 | 10/2017 | Wang |
| 2017/0329201 A1 | 11/2017 | Arnold |
| 2017/0374352 A1 | 12/2017 | Horesh |
| 2018/0035101 A1 | 2/2018 | Osterhout |
| 2018/0044234 A1 | 2/2018 | Hokansson et al. |
| 2018/0045953 A1 | 2/2018 | Fan et al. |
| 2018/0052320 A1 | 2/2018 | Curtis et al. |
| 2018/0107015 A1 | 4/2018 | Dümpelmann et al. |
| 2018/0129866 A1 | 5/2018 | Hicks et al. |
| 2018/0216797 A1 | 8/2018 | Khorasaninejad et al. |
| 2018/0217395 A1 | 8/2018 | Lin et al. |
| 2018/0231700 A1 | 8/2018 | Ahmed et al. |
| 2018/0236596 A1 | 8/2018 | Ihlemann et al. |
| 2018/0246262 A1 | 8/2018 | Zhan et al. |
| 2018/0248268 A1 | 8/2018 | Shvets et al. |
| 2018/0252857 A1 | 9/2018 | Glik et al. |
| 2018/0259700 A1 | 9/2018 | Khorasaninejad et al. |
| 2018/0259757 A1 | 9/2018 | Urzhumov |
| 2018/0267605 A1 | 9/2018 | Border |
| 2018/0274750 A1 | 9/2018 | Byrnes et al. |
| 2018/0299595 A1 | 10/2018 | Arbabi et al. |
| 2018/0314130 A1 | 11/2018 | Joo et al. |
| 2018/0341090 A1 | 11/2018 | Devlin et al. |
| 2018/0364158 A1 | 12/2018 | Wang et al. |
| 2019/0003892 A1 | 1/2019 | Aieta et al. |
| 2019/0025463 A1 | 1/2019 | She et al. |
| 2019/0025477 A1 | 1/2019 | She et al. |
| 2019/0041642 A1 | 2/2019 | Haddick et al. |
| 2019/0041660 A1 | 2/2019 | Ahmed |
| 2019/0041736 A1 | 2/2019 | Grunnet-jepsen et al. |
| 2019/0044003 A1 | 2/2019 | Heck et al. |
| 2019/0049632 A1* | 2/2019 | Shin .................... G02B 21/34 |
| 2019/0049732 A1 | 2/2019 | Lee et al. |
| 2019/0057512 A1 | 2/2019 | Han et al. |
| 2019/0064532 A1 | 2/2019 | Riley, Jr. et al. |
| 2019/0079321 A1 | 3/2019 | Wu et al. |

(56) References Cited

U.S. PATENT DOCUMENTS

| | | | |
|---|---|---|---|
| 2019/0086579 A1 | 3/2019 | Kim et al. | |
| 2019/0086683 A1 | 3/2019 | Aieta et al. | |
| 2019/0101448 A1 | 4/2019 | Lee et al. | |
| 2019/0113775 A1 | 4/2019 | Jang et al. | |
| 2019/0120817 A1 | 4/2019 | Anderson | |
| 2019/0121004 A1 | 4/2019 | Ahmed et al. | |
| 2019/0137075 A1 | 5/2019 | Aieta et al. | |
| 2019/0137762 A1* | 5/2019 | Hu | G02B 27/144 |
| 2019/0137793 A1 | 5/2019 | Luo et al. | |
| 2019/0154877 A1 | 5/2019 | Capasso et al. | |
| 2019/0170655 A1 | 6/2019 | Smith | |
| 2019/0196068 A1* | 6/2019 | Tsai | G02B 1/002 |
| 2019/0206136 A1 | 7/2019 | West et al. | |
| 2019/0219835 A1 | 7/2019 | Skinner et al. | |
| 2019/0235139 A1 | 8/2019 | Chen et al. | |
| 2019/0250107 A1 | 8/2019 | Sreenivasan et al. | |
| 2019/0369401 A1 | 12/2019 | Rolland et al. | |
| 2019/0377084 A1 | 12/2019 | Sleasman et al. | |
| 2019/0391378 A1 | 12/2019 | Eichelkraut et al. | |
| 2020/0025888 A1 | 1/2020 | Jang et al. | |
| 2020/0096672 A1 | 3/2020 | Yu et al. | |
| 2020/0150311 A1 | 5/2020 | Zhang et al. | |
| 2020/0271941 A1 | 8/2020 | Riley, Jr. et al. | |
| 2021/0149081 A1* | 5/2021 | Groever | G02B 5/1842 |
| 2021/0190593 A1 | 6/2021 | Yao et al. | |
| 2021/0200992 A1 | 7/2021 | Padmanabhan et al. | |
| 2021/0208469 A1 | 7/2021 | Didomenico | |
| 2021/0263329 A1 | 8/2021 | Latawiec | |
| 2021/0288095 A1* | 9/2021 | Delga | H01L 27/14625 |
| 2021/0302763 A1 | 9/2021 | Yao et al. | |
| 2021/0311588 A1* | 10/2021 | Han | H01S 5/12 |
| 2021/0333150 A1 | 10/2021 | Mceldowney et al. | |
| 2022/0050294 A1* | 2/2022 | Fermigier | G02C 7/024 |
| 2022/0052093 A1 | 2/2022 | Devlin et al. | |
| 2022/0091428 A1 | 3/2022 | Riley, Jr. et al. | |
| 2022/0107263 A1 | 4/2022 | Biesinger et al. | |
| 2022/0206186 A1 | 6/2022 | Chen et al. | |
| 2022/0214219 A1 | 7/2022 | Faraon et al. | |
| 2023/0194883 A1 | 6/2023 | Riley et al. | |
| 2023/0196842 A1 | 6/2023 | Devlin et al. | |
| 2023/0280498 A1 | 9/2023 | Altuzarra et al. | |
| 2023/0314827 A1 | 10/2023 | Devlin et al. | |
| 2023/0318261 A1 | 10/2023 | Tamagnone et al. | |

FOREIGN PATENT DOCUMENTS

| | | |
|---|---|---|
| CN | 101158727 A | 4/2008 |
| CN | 101164147 A | 4/2008 |
| CN | 100476504 C | 4/2009 |
| CN | 101681095 A | 3/2010 |
| CN | 101510013 B | 6/2010 |
| CN | 101510012 B | 8/2010 |
| CN | 101510011 B | 9/2010 |
| CN | 101241173 B | 8/2011 |
| CN | 202854395 U | 4/2013 |
| CN | 103092049 A | 5/2013 |
| CN | 203799117 U | 8/2014 |
| CN | 104932043 A | 9/2015 |
| CN | 204719330 U | 10/2015 |
| CN | 103869484 B | 1/2016 |
| CN | 105655286 A | 6/2016 |
| CN | 105676314 A | 6/2016 |
| CN | 105917277 A | 8/2016 |
| CN | 105974503 A | 9/2016 |
| CN | 103257441 B | 10/2016 |
| CN | 205620619 U | 10/2016 |
| CN | 104834079 B | 4/2017 |
| CN | 106611699 A | 5/2017 |
| CN | 104834089 B | 6/2017 |
| CN | 106848555 A | 6/2017 |
| CN | 106200276 B | 10/2017 |
| CN | 104834088 B | 12/2017 |
| CN | 105676314 B | 1/2018 |
| CN | 107561857 A | 1/2018 |
| CN | 108089325 A | 5/2018 |
| CN | 108291983 A | 7/2018 |
| CN | 207623619 U | 7/2018 |
| CN | 106199997 B | 8/2018 |
| CN | 108474869 A | 8/2018 |
| CN | 108507542 A | 9/2018 |
| CN | 207923075 U | 9/2018 |
| CN | 108680544 A | 10/2018 |
| CN | 108761779 A | 11/2018 |
| CN | 109000692 A | 12/2018 |
| CN | 208270846 U | 12/2018 |
| CN | 109196387 A | 1/2019 |
| CN | 106199956 B | 2/2019 |
| CN | 109360139 A | 2/2019 |
| CN | 106950195 B | 5/2019 |
| CN | 106324832 B | 7/2019 |
| CN | 106526730 B | 7/2019 |
| CN | 106485761 B | 8/2019 |
| CN | 110160685 A | 8/2019 |
| CN | 110678773 A | 1/2020 |
| CN | 111316138 A | 6/2020 |
| CN | 111656707 A | 9/2020 |
| CN | 213092332 U | 4/2021 |
| CN | 113050295 A | 6/2021 |
| CN | 113168022 A | 7/2021 |
| CN | 110376665 B | 8/2021 |
| CN | 213902664 U | 8/2021 |
| CN | 213903843 U | 8/2021 |
| CN | 214098104 U | 8/2021 |
| CN | 113703080 A | 11/2021 |
| CN | 113791524 A | 12/2021 |
| CN | 113807312 A | 12/2021 |
| CN | 113820839 A | 12/2021 |
| CN | 113834568 A | 12/2021 |
| CN | 113835227 A | 12/2021 |
| CN | 113851573 A | 12/2021 |
| CN | 215005942 U | 12/2021 |
| CN | 215010478 U | 12/2021 |
| CN | 110494771 B | 1/2022 |
| CN | 113885106 A | 1/2022 |
| CN | 113899451 A | 1/2022 |
| CN | 113900078 A | 1/2022 |
| CN | 113900162 A | 1/2022 |
| CN | 113917574 A | 1/2022 |
| CN | 113917578 A | 1/2022 |
| CN | 113934004 A | 1/2022 |
| CN | 113934005 A | 1/2022 |
| CN | 113959984 A | 1/2022 |
| CN | 114002707 A | 2/2022 |
| CN | 114019589 A | 2/2022 |
| CN | 114047632 A | 2/2022 |
| CN | 114047637 A | 2/2022 |
| CN | 114112058 A | 3/2022 |
| CN | 114156168 A | 3/2022 |
| CN | 114176492 A | 3/2022 |
| CN | 215932365 U | 3/2022 |
| CN | 114280704 A | 4/2022 |
| CN | 114280716 A | 4/2022 |
| CN | 114286953 A | 4/2022 |
| CN | 114296180 A | 4/2022 |
| CN | 114325886 A | 4/2022 |
| CN | 114326163 A | 4/2022 |
| CN | 114354141 A | 4/2022 |
| CN | 114373825 A | 4/2022 |
| CN | 114384612 A | 4/2022 |
| CN | 114397092 A | 4/2022 |
| CN | 114397718 A | 4/2022 |
| CN | 114415386 A | 4/2022 |
| CN | 216345776 U | 4/2022 |
| CN | 216351311 U | 4/2022 |
| CN | 216351591 U | 4/2022 |
| CN | 216355281 U | 4/2022 |
| CN | 216361353 U | 4/2022 |
| CN | 114488365 A | 5/2022 |
| CN | 114543993 A | 5/2022 |
| CN | 114545367 A | 5/2022 |
| CN | 114545370 A | 5/2022 |
| CN | 114554062 A | 5/2022 |
| CN | 114561266 A | 5/2022 |
| CN | 216593224 U | 5/2022 |

(56) References Cited

FOREIGN PATENT DOCUMENTS

| | | |
|---|---|---|
| CN | 216605227 U | 5/2022 |
| CN | 216622749 U | 5/2022 |
| CN | 114578642 A | 6/2022 |
| CN | 114593689 A | 6/2022 |
| CN | 114623960 A | 6/2022 |
| CN | 114624878 A | 6/2022 |
| CN | 114660683 A | 6/2022 |
| CN | 114660780 A | 6/2022 |
| CN | 114690387 A | 7/2022 |
| CN | 114740631 A | 7/2022 |
| CN | 114743714 A | 7/2022 |
| CN | 114779437 U | 7/2022 |
| CN | 216896898 U | 7/2022 |
| CN | 216900930 U | 7/2022 |
| CN | 216901121 U | 7/2022 |
| CN | 216901165 U | 7/2022 |
| CN | 216901317 U | 7/2022 |
| CN | 216901952 U | 7/2022 |
| CN | 216903719 U | 7/2022 |
| CN | 216933177 U | 7/2022 |
| CN | 217034311 U | 7/2022 |
| CN | 217034418 U | 7/2022 |
| CN | 217034466 U | 7/2022 |
| CN | 114859446 A | 8/2022 |
| CN | 114859447 A | 8/2022 |
| CN | 114859570 A | 8/2022 |
| CN | 114935741 A | 8/2022 |
| CN | 217276608 U | 8/2022 |
| CN | 217278911 U | 8/2022 |
| CN | 217278915 U | 8/2022 |
| CN | 217278989 U | 8/2022 |
| CN | 217279003 U | 8/2022 |
| CN | 217279087 U | 8/2022 |
| CN | 217279110 U | 8/2022 |
| CN | 217279168 U | 8/2022 |
| CN | 217279244 U | 8/2022 |
| CN | 217280797 U | 8/2022 |
| CN | 217280851 U | 8/2022 |
| CN | 217281621 U | 8/2022 |
| CN | 217281623 U | 8/2022 |
| CN | 114995038 A | 9/2022 |
| CN | 115016099 A | 9/2022 |
| CN | 115016150 A | 9/2022 |
| CN | 115032766 A | 9/2022 |
| CN | 115047432 A | 9/2022 |
| CN | 115047653 A | 9/2022 |
| CN | 115061114 A | 9/2022 |
| CN | 115079415 A | 9/2022 |
| CN | 115113174 A | 9/2022 |
| CN | 217456368 U | 9/2022 |
| CN | 217465697 U | 9/2022 |
| CN | 217466052 U | 9/2022 |
| CN | 217466667 U | 9/2022 |
| CN | 217467162 U | 9/2022 |
| CN | 217467176 U | 9/2022 |
| CN | 217467177 U | 9/2022 |
| CN | 217467226 U | 9/2022 |
| CN | 217467326 U | 9/2022 |
| CN | 217467327 U | 9/2022 |
| CN | 217467336 U | 9/2022 |
| CN | 217467338 U | 9/2022 |
| CN | 217467351 U | 9/2022 |
| CN | 217467352 U | 9/2022 |
| CN | 217467353 U | 9/2022 |
| CN | 217467355 U | 9/2022 |
| CN | 217467357 U | 9/2022 |
| CN | 217467358 U | 9/2022 |
| CN | 217467363 U | 9/2022 |
| CN | 217467364 U | 9/2022 |
| CN | 217467367 U | 9/2022 |
| CN | 217467368 U | 9/2022 |
| CN | 217467395 U | 9/2022 |
| CN | 217467396 U | 9/2022 |
| CN | 217467399 U | 9/2022 |
| CN | 217467439 U | 9/2022 |
| CN | 217467452 U | 9/2022 |
| CN | 115164714 A | 10/2022 |
| CN | 115166876 A | 10/2022 |
| CN | 115166958 A | 10/2022 |
| CN | 115185082 A | 10/2022 |
| CN | 115211799 A | 10/2022 |
| CN | 115236795 A | 10/2022 |
| CN | 217639515 U | 10/2022 |
| CN | 217639519 U | 10/2022 |
| CN | 217639539 U | 10/2022 |
| CN | 217639544 U | 10/2022 |
| CN | 217639611 U | 10/2022 |
| CN | 217639612 U | 10/2022 |
| CN | 217639613 U | 10/2022 |
| CN | 217639715 U | 10/2022 |
| CN | 217639718 U | 10/2022 |
| CN | 217639719 U | 10/2022 |
| CN | 217639720 U | 10/2022 |
| CN | 217639722 U | 10/2022 |
| CN | 217639723 U | 10/2022 |
| CN | 217639724 U | 10/2022 |
| CN | 217639725 U | 10/2022 |
| CN | 217639726 U | 10/2022 |
| CN | 217639763 U | 10/2022 |
| CN | 217639765 U | 10/2022 |
| CN | 217639767 U | 10/2022 |
| CN | 217639768 U | 10/2022 |
| CN | 217639769 U | 10/2022 |
| CN | 217639770 U | 10/2022 |
| CN | 217639771 U | 10/2022 |
| CN | 217639772 U | 10/2022 |
| CN | 217639773 U | 10/2022 |
| CN | 217639774 U | 10/2022 |
| CN | 217639776 U | 10/2022 |
| CN | 217639777 U | 10/2022 |
| CN | 217639778 U | 10/2022 |
| CN | 217639903 U | 10/2022 |
| CN | 217639920 U | 10/2022 |
| CN | 115268058 A | 11/2022 |
| CN | 115327865 A | 11/2022 |
| CN | 115332917 A | 11/2022 |
| CN | 115343795 A | 11/2022 |
| CN | 115390176 A | 11/2022 |
| CN | 217809433 U | 11/2022 |
| CN | 217818613 U | 11/2022 |
| CN | 217819022 U | 11/2022 |
| CN | 217820828 U | 11/2022 |
| CN | 217820829 U | 11/2022 |
| CN | 217820831 U | 11/2022 |
| CN | 217820834 U | 11/2022 |
| CN | 217820838 U | 11/2022 |
| CN | 217820839 U | 11/2022 |
| CN | 217820840 U | 11/2022 |
| CN | 217820943 U | 11/2022 |
| CN | 217820944 U | 11/2022 |
| CN | 217820945 U | 11/2022 |
| CN | 217820971 U | 11/2022 |
| CN | 217821058 U | 11/2022 |
| CN | 217821068 U | 11/2022 |
| CN | 217821071 U | 11/2022 |
| CN | 217821091 U | 11/2022 |
| CN | 217821110 U | 11/2022 |
| CN | 217821111 U | 11/2022 |
| CN | 217821113 U | 11/2022 |
| CN | 217821122 U | 11/2022 |
| CN | 217821160 U | 11/2022 |
| CN | 217821236 U | 11/2022 |
| CN | 217821680 U | 11/2022 |
| CN | 217821696 U | 11/2022 |
| CN | 217822825 U | 11/2022 |
| CN | 217823690 U | 11/2022 |
| CN | 217825178 U | 11/2022 |
| CN | 217885960 U | 11/2022 |
| CN | 217902220 U | 11/2022 |
| CN | 217902222 U | 11/2022 |
| CN | 115421295 A | 12/2022 |
| CN | 115453754 A | 12/2022 |
| CN | 115524768 A | 12/2022 |
| CN | 115524775 A | 12/2022 |

(56) References Cited

FOREIGN PATENT DOCUMENTS

| | | |
|---|---|---|
| CN | 115524874 A | 12/2022 |
| CN | 217981833 U | 12/2022 |
| CN | 217981857 U | 12/2022 |
| CN | 217981991 U | 12/2022 |
| CN | 217981992 U | 12/2022 |
| CN | 217982020 U | 12/2022 |
| CN | 217982038 U | 12/2022 |
| CN | 217982089 U | 12/2022 |
| CN | 217982120 U | 12/2022 |
| CN | 217983382 U | 12/2022 |
| CN | 217984044 U | 12/2022 |
| DE | 102007058558 A1 | 6/2009 |
| DE | 102009037629 A1 | 2/2011 |
| DE | 102012212753 A1 | 1/2014 |
| DE | 102015221985 A1 | 5/2017 |
| DE | 102016218996 A1 | 9/2017 |
| DE | 112018002811 T5 | 2/2020 |
| DE | 112018002670 T5 | 3/2020 |
| EP | 1251397 A2 | 10/2002 |
| EP | 1252623 B1 | 10/2004 |
| EP | 2631740 A2 | 8/2013 |
| EP | 2763519 A2 | 8/2014 |
| EP | 2338114 B1 | 3/2017 |
| EP | 3226042 A1 | 10/2017 |
| EP | 3353578 A1 | 8/2018 |
| EP | 3380876 A1 | 10/2018 |
| EP | 3385770 A1 | 10/2018 |
| EP | 3440484 A1 | 2/2019 |
| EP | 3504566 A2 | 7/2019 |
| EP | 3631533 A1 | 4/2020 |
| EP | 3676973 A1 | 7/2020 |
| EP | 3799626 A1 | 4/2021 |
| EP | 4004608 A1 | 6/2022 |
| GB | 2490895 A | 11/2012 |
| GB | 2499869 B | 3/2018 |
| GB | 2578049 A | 4/2020 |
| GB | 2578233 A | 4/2020 |
| GB | 2578236 A | 4/2020 |
| HK | 40010538 | 7/2020 |
| JP | 2017062373 A | 3/2017 |
| JP | 2018536204 A | 12/2018 |
| JP | 2018537804 A | 12/2018 |
| JP | 2019516128 A | 6/2019 |
| JP | 2022542172 A | 9/2022 |
| KR | 20080099452 A | 11/2008 |
| KR | 20080103149 A | 11/2008 |
| KR | 20090002583 A | 1/2009 |
| KR | 101493928 B1 | 3/2015 |
| KR | 20170015109 A | 2/2017 |
| KR | 20180083885 A | 7/2018 |
| KR | 20180121309 A | 11/2018 |
| KR | 20180124106 A | 11/2018 |
| KR | 101905444 B1 | 12/2018 |
| KR | 20190038221 A | 4/2019 |
| KR | 102036640 B1 | 10/2019 |
| KR | 10-2020-0008630 A | 1/2020 |
| KR | 20210088520 A | 7/2021 |
| KR | 1020220035971 A | 3/2022 |
| SG | 11201804346 P | 6/2018 |
| SG | 11201808772 W | 11/2018 |
| SG | 11202001717 | 2/2023 |
| TW | 201908232 A | 3/2019 |
| WO | 0043750 A2 | 7/2000 |
| WO | 2007141788 A2 | 12/2007 |
| WO | 2008020899 A2 | 2/2008 |
| WO | 2009067540 A1 | 5/2009 |
| WO | 2009124181 A2 | 10/2009 |
| WO | 2011106553 A2 | 9/2011 |
| WO | 2011106553 A3 | 1/2012 |
| WO | 2012122677 A1 | 9/2012 |
| WO | 2012139634 A1 | 10/2012 |
| WO | 2012144997 A1 | 10/2012 |
| WO | 2012172366 A1 | 12/2012 |
| WO | 2013033591 A1 | 3/2013 |
| WO | 2015021255 A1 | 2/2015 |
| WO | 2015077926 A1 | 6/2015 |
| WO | 2015112939 A1 | 7/2015 |
| WO | 2016049629 A1 | 3/2016 |
| WO | 2016051325 A1 | 4/2016 |
| WO | 2016086204 A1 | 6/2016 |
| WO | 2016140720 A2 | 9/2016 |
| WO | 2016140720 A3 | 10/2016 |
| WO | 2016168173 A1 | 10/2016 |
| WO | 2016178740 A2 | 11/2016 |
| WO | 2016191142 A2 | 12/2016 |
| WO | 2017005709 A1 | 1/2017 |
| WO | 2017053309 A1 | 3/2017 |
| WO | 2017079480 A1 | 5/2017 |
| WO | 2017091738 A1 | 6/2017 |
| WO | 2017176921 A1 | 10/2017 |
| WO | 2017182771 A1 | 10/2017 |
| WO | 2018063455 A1 | 4/2018 |
| WO | 2018067246 A2 | 4/2018 |
| WO | 2018063455 A9 | 5/2018 |
| WO | 2018118984 A1 | 6/2018 |
| WO | 2018134215 A1 | 7/2018 |
| WO | 2018067246 A3 | 8/2018 |
| WO | 2018142339 A1 | 8/2018 |
| WO | 2018204856 A1 | 11/2018 |
| WO | 2018218063 A1 | 11/2018 |
| WO | 2018219710 A1 | 12/2018 |
| WO | 2018222944 A1 | 12/2018 |
| WO | 2019015735 A1 | 1/2019 |
| WO | 2019039241 A1 | 2/2019 |
| WO | 2019043016 A1 | 3/2019 |
| WO | 2019046827 A1 | 3/2019 |
| WO | 2019057907 A1 | 3/2019 |
| WO | 2019075335 A1 | 4/2019 |
| WO | 2019101750 A2 | 5/2019 |
| WO | 2019103762 A2 | 5/2019 |
| WO | 2019108290 A1 | 6/2019 |
| WO | 2019116364 A1 | 6/2019 |
| WO | 2019118646 A1 | 6/2019 |
| WO | 2019119025 A1 | 6/2019 |
| WO | 2019103762 A3 | 7/2019 |
| WO | 2019136166 A1 | 7/2019 |
| WO | WO-2019136166 A1 * | 7/2019 |
| WO | 2019103762 A9 | 8/2019 |
| WO | 2019147828 A1 | 8/2019 |
| WO | 2019148200 A1 | 8/2019 |
| WO | 2019164542 A1 | 8/2019 |
| WO | 2019164849 A1 | 8/2019 |
| WO | 2019173357 A1 | 9/2019 |
| WO | 2019198568 A1 | 10/2019 |
| WO | 2019203876 A2 | 10/2019 |
| WO | 2019204667 A1 | 10/2019 |
| WO | 2019206430 A1 | 10/2019 |
| WO | 2020001938 A1 | 1/2020 |
| WO | 2020010084 A1 | 1/2020 |
| WO | 2020101568 A1 | 5/2020 |
| WO | 2020176227 A1 | 9/2020 |
| WO | WO-2020214617 A1 * | 10/2020 | ............ G02B 1/002 |
| WO | 2021021671 A1 | 2/2021 |
| WO | WO-2021130085 A1 * | 7/2021 | ............ G02B 1/002 |
| WO | WO-2021230868 A1 * | 11/2021 | ............ G01N 21/64 |
| WO | 2022150816 A1 | 7/2022 |
| WO | 2023115037 A1 | 6/2023 |

OTHER PUBLICATIONS

International Search Report and Written Opinion for International Application No. PCT/US2018/034460, Search completed Jul. 29, 2018, dated Aug. 24, 2018, 10 pgs.

International Search Report and Written Opinion for International Application No. PCT/US2018/035502, Search completed Jul. 31, 2018, dated Aug. 24, 2018, 13 pgs.

International Search Report and Written Opinion for International Application No. PCT/US2018/038357, Search completed Apr. 9, 2019, dated May 13, 2019, 12 pgs.

International Search Report and Written Opinion for International Application No. PCT/US2018/046947, Search completed Oct. 14, 2019, dated Oct. 25, 2019, 10 pgs.

(56) References Cited

OTHER PUBLICATIONS

International Search Report and Written Opinion for International Application No. PCT/US2018/049276, Search completed Oct. 26, 2018, dated Jan. 15, 2019, 12 pgs.
Invitation to Pay Additional Fees and Partial Search Report Received for International Application PCT/US2020/028157, dated Jun. 19, 2020, 2 pgs.
Office Action for Chinese Patent Application No. 201680077924.9, dated Aug. 30, 2019, 10 pgs.
Office Action for Chinese Patent Application No. 201780031669.9, dated Mar. 4, 2020, 29 pgs.
Search Report and Written Opinion for International Application No. 11201808772W, Search completed Jan. 20, 2020, dated Jan. 28, 2020, 12 pgs.
Supplementary Partial European Search Report for European Application No. 16869282.0, Search completed Jun. 19, 2019, dated Jul. 2, 2019, 12 pgs.
"Materials for High and Low Refractive Index Coatings", Sigma-Aldrich tech. www.sigmaaldrich.com/materials-science/organic-electronics/ri-coatings.html (3 pgs.).
"These Tiny, Incredible 'Metalenses' are the Next Giant Leap in Optics", PetaPixel, Jun. 3, 2016, 21 pgs.
Aieta et al., "Aberration-Free Ultrathin Flat Lenses and Axicons at Telecom Wavelengths Based on Plasmonic Metasurfaces", Nano Lett., Web publication date Aug. 2012, vol. 12, No. 9, pp. 4932-4936.
Aieta et al., "Aberrations of flat lenses and aplanatic metasurfaces", Optics Express, Dec. 16, 2013, vol. 21, No. 25, pp. 31530-31539, doi: 10.1364/oe.21.031530.
Aieta et al., "Multiwavelength achromatic metasurfaces by dispersive phase compensation", Science, Mar. 20, 2015, vol. 347, No. 6228, pp. 1342-1345, doi: 10.1126/science.aaa2494.
Aieta et al., "Multiwavelength achromatic metasurfaces by dispersive phase compensation", Sciencexpress Reports, Feb. 19, 2015, 8 pgs., doi: 10.1126/science.aaa2494.
Aieta et al., "Out-of-Plane Reflection and Refraction of Light by Anisotropic Optical Antenna Metasurfaces with Phase Discontinuities", Nano Letters, Feb. 15, 2012, vol. 12, No. 3, pp. 1702-1706, doi: 10.1021/nl300204s.
Arbabi et al., "Dielectric Metasurfaces for Complete Control of Phase and Polarization with Subwavelength Spatial Resolution and High Transmission", Nature Nanotechnology, Aug. 31, 2015, 27 pgs., doi:10.1038/nnano.2015.186.
Arbabi et al., "Miniature optical planar camera based on a wide-angle metasurface doublet corrected for monochromatic aberrations", Nature Communications, 2016, vol. 7, No. 13682, 9 pgs., doi:10.1038/ncomms13682.
Arbabi et al., "Subwavelength-thick lenses with high numerical apertures and large efficiency based on high-contrast transmitarrays", Nature Communications, May 5, 2015, vol. 6, pp. 7069, doi:10.1038/ncomms8069.
Azadegan et al., "A novel approach for miniaturization of slot antennas", IEEE Transactions on Antennas and Propagation, Mar. 2003, vol. 51, No. 3, pp. 421-429, doi:10.1109/TAP.2003.809853.
Blanchard et al., "Modeling nanoscale, V-shaped antennas for the design of optical phased arrays", Physical Review, Apr. 30, 2012, vol. B 85, pp. 155457-1-155457-11, DOI: 10.1103/physRevB.85.155457.
Buralli et al., "Optical Performance of Holographic Kinoforms", Applied Optics, Mar. 1, 1989, vol. 28, No. 5, pp. 976-983, doi: 10.1364/AO.28.000976.
Byrnes et al., "Designing large, high-efficiency, high-numerical-aperture, transmissive meta-lenses for visible light", Optics Express, vol. 24, No. 5, Mar. 7, 2016, pp. 5110-5124.
Campione et al., "Tailoring dielectric resonator geometries for directional scattering and Huygens' metasurface", Optics Express, Feb. 9, 2015, vol. 23, Issue 3, published online Jan. 28, 2015, pp. 2293-2304, arXiv:1410.2315, DOI: 10.1364/OE.23.002293.
Chen et al., "A broadband achromatic metalens for focusing and imaging in the visible", Nature Nanotechnology, Jan. 1, 2018, vol. 13, pp. 220-226, doi: 10.1038/s41565-017-0034-6.
Chen et al., "A review of metasurfaces: physics and applications", Reports on Progress in Physics, Jun. 16, 2016, vol. 79, 076401, 40 pgs., doi: 10.1088/0034-4885/79/7/076401.
Chen et al., "Dual-polarity plasmonic metalens for visible light", Nature Communications, Nov. 13, 2012, vol. 3, No. 1198, pp. 1-6, DOI 10.10388/ncomms2207.
Chen et al., "High-Efficiency Broadband Meta-Hologram with Polarization—Controlled Dual Images", Nano Letters, 2014, vol. 14, No. 1, published online Dec. 13, 2013, pp. 225-230, https://doi.org.10.1021/nl403811d.
Chen et al., "Immersion Meta-Lenses at Visible Wavelengths for Nanoscale Imaging", Nano Letters, Apr. 7, 2017, vol. 17, No. 5, pp. 3188-3194, doi: 10.1021/acs.nanolett.7b00717.
Chen et al., "Phase and dispersion engineering of metalenses: broadband achromatic focusing and imaging in the visible", Nov. 26, 2017. Cornell University. [retrieved on Apr. 11, 2019). Retrieved from the Internet: <URL:https://arxiv.org/abs/1711.09343v1 >. entire document.
Chou et al., "Imprint lithography with 25-nanometer resolution", Science, Apr. 5, 1996, vol. 272, Issue 5258, pp. 85-87.
Decker et al., "High-efficiency light-wave control with all-dielectric optical Huygens' metasurfaces", Advanced Optical Materials, arXiv:1405.5038, May 2014, pp. 813-820, doi: 10.1002/adom.201400584.
Devlin et al., "Arbitrary spin-to-orbital angular momentum conversion of light", Science, Nov. 17, 2017, vol. 358, pp. 896-901.
Devlin et al., "Broadband high-efficiency dielectric metasurfaces for the visible spectrum", Proceedings of the National Academy of Sciences of USA, Sep. 20, 2016, vol. 113, No. 38, pp. 10473-10478, doi: 10.1073/pnas.1611740113.
Devlin et al., "High efficiency dielectric metasurfaces at visible wavelengths", Mar. 8, 2016 (Mar. 8, 2016), Retrieved from the Internet: URL: https://arxiv.org/ftp/arxiv/papers/1603/1603.02735.pdf.
Evlyukhin et al., "Optical response features of Si-nanoparticle arrays", Physical Review B, 2010, vol. 82, 045404-1-045404-11, DOI: 10.1103/PhysRevB.82.045404.
Fattal et al., "Flat dielectric grating reflectors with focusing abilities", Nature Photonics, May 2, 2010, vol. 4, No. 7, XP055162682, doi: 10.1038/nphoton.2010.116.
Genevet et al., "Breakthroughs in Photonics 2013: Flat Optics: Wavefronts Control with Huygens' Interfaces", IEEE Photonics Journal, Apr. 1, 2014, vol. 6, No. 2, pp. 1-4, XP011546594, doi: 10.1109/jphot.2014.2308194.
Genevet et al., "Recent advances in planar optics: from plasmonic to dielectric metasurfaces", Optica, Jan. 19, 2017, vol. 4, No. 1, doi: 10.1364/OPTICA.4.000139.
Goldberg, "Genetic Algorithms in Search, Optimization, and Machine Learning", Addison-Wesley, 1989, 432 pgs. (presented in two parts).
Groever et al., "Meta-Lens Doublet in the Visible Region", Nano Letters, Jun. 29, 2017, vol. 17, No. 8, pp. 4902-4907, doi: 10.1021/acs.nanolett.7b01888.
Hartwig et al., "Challenges for Reducing the Size of Laser Activated Remote Phosphor Light Engines for DLP Projection", Proceedings of SPIE, International Optical Design Conference, Dec. 17, 2014, vol. 9293, pp. 929313-1 to 929313-6, doi: 10.1117/12.2073275, ISBN: 978-1-62841-730-2.
Hidber et al., "Microcontact printing of Palladium colloids: micron-scale patterning by electroless deposition of copper", 1996, Langmuir, The ACS Journal of Surfaces and Colloids, vol. 12, pp. 1375-1380.
Jin et al., "Waveforms for Optimal Sub-keV High-Order Harmonics with Synthesized Two- or Three-Colour Laser Fields", Nature Communications, May 30, 2014, vol. 5, No. 4003, pp. 1-6.
Kats et al., "Giant birefringence in optical antenna arrays with widely tailorable optical anisotropy", PNAS, Jul. 31, 2012, vol. 109, No. 31, pp. 12364-12368, www.pnas.org/cgi/doi/10.1073/pnas.1210686109.

(56) References Cited

OTHER PUBLICATIONS

Khorasaninejad et al., "Visible Wavelength Planar Metalenses Based on Titanium Dioxide", IEEE Journal of Selected Topics in Quantum Electronics, May/Jun. 2017, vol. 23, No. 3, pp. 43-58.

Khorasaninejad et al., "Achromatic Metalens over 60 nm Bandwidth in the Visible and Metalens with Reverse Chromatic Dispersion", Nano Letters, Jan. 26, 2017, vol. 17, No. 3, pp. 1819-1824, doi: 10.1021/acs.nanolett.6b05137.

Khorasaninejad et al., "Achromatic Metasurface Lens at Telecommunication Wavelengths", Nano Letters, Jul. 13, 2015, vol. 15, No. 8, pp. 5358-5362, doi: 10.1021/acs.nanolett.5b01727.

Khorasaninejad et al., "Broadband and chiral binary dielectric meta-holograms", Science Advances, May 13, 2016, vol. 2, No. 5, 6 pgs.

Khorasaninejad et al., "Broadband Multifunctional Efficient Meta-Gratings Based on Dielectric Waveguide Phase Shifters", Nano Letters, Sep. 15, 2015, vol. 15, No. 10, pp. 6709-6715, doi: 10.1021/acs.nanolett.5b02524.

Khorasaninejad et al., "Metalenses at visible wavelengths: Diffraction—limited focusing and subwavelength resolution imaging", Science, Jun. 3, 2016, vol. 352, No. 6290, pp. 1190-1194, doi: 10.1126/science.aaf6644.

Khorasaninejad et al., "Multispectral Chiral Imaging with a Metalens", Nano Letters, Jun. 7, 2016, vol. 16, pp. 4595-4600, doi: 10.1021/acs.nanolett.6b01897.

Khorasaninejad et al., "Planar Lenses at Visible Wavelengths", Arxiv, May 7, 2016, 17 pages.

Khorasaninejad et al., "Polarization-Insensitive Metalenses at Visible Wavelengths", Nano Letters, Oct. 24, 2016, vol. 16, No. 11, pp. 7229-7234, doi: 10.1021/acs.nanolett.6b03626.

Khorasaninejad et al., "Super-Dispersive Off-Axis Meta-Lenses for Compact High Resolution Spectroscopy", Nano Letters, Apr. 27, 2016, vol. 16, No. 6, pp. 3732-3737, doi: 10.1021/acs.nanolett.6b01097.

Kildishev et al., "Planar Photonics with Metasurfaces", Science, Mar. 15, 2013, vol. 339, No. 6125, pp. 1232009-1-1232009-6.

Kominami et al., "Dipole and Slot Elements and Arrays on Semi-Infinite Substrates", IEEE Transactions on Antennas and Propagation, Jun. 1985, vol. AP33, No. 6, pp. 600-607.

Krasnok et al., "All-dielectric optical nanoantennas", Optics Express, Aug. 23, 2012, vol. 20, No. 18, pp. 20599-20604.

Kress et al., "Applied Digital Optics from Micro-Optics to Nanophotonics", Applied Digital Optics, 2009, Wiley, 30 pgs.

Lalanne et al., "Interaction between optical nano-objects at metallo-dielectric interfaces", Nature Physics, Aug. 2006, vol. 2, pp. 551-556, doi:10.1038/nphys364.

Leveque et al., "Transient behavior of surface plasmon polaritons scattered at a subwavelength groove", Physical Reviews B, 76, Oct. 18, 2007, pp. 155418-1-155418-8, DOI: 10.1103/PhysRevB.76.155418.

Lezec et al., "Beaming Light from a Subwavelength Aperture", Science Express, Aug. 2, 2002, vol. 297, pp. 820-822.

Li et al., "Achromatic Flat Optical Components via Compensation between Structure and Material Dispersions", Scientific Reports, 2016, vol. 6, No. 19885, 7 pgs., DOI:10.1038/srep19885.

Li et al., "Flat metasurfaces to focus electromagnetic waves in reflection geometry", Optics Letters, 2012, vol. 37, No. 23, pp. 4940-4942.

Lin et al., "Dielectric gradient metasurface optical elements", Science, Jul. 18, 2014, vol. 345, Issue 6194, pp. 298-302, DOI: 10.1126/science.1253213.

Liu et al., "Realization of polarization evolution on higher-order Poincare sphere with metasurface", Applied Physics Letters, 2014, vol. 104, pp. 191110-1-191101-4, http://dx.doi.org/10.1063/1.4878409.

Lo et al., "New Architecture for Space Telescopes Uses Fresnel Lenses", SPIE Newsroom, Aug. 9, 2006, 2 pgs., doi: 10.1117/2.1200608.0333.

Lu et al., "Planar high-numerical-aperture low-loss focusing reflectors and lenses using subwavelength high contrast gratings", Optics Express, Jun. 7, 2010, vol. 18, No. 12, pp. 12606-12614, doi: 10.1364/OE.18.012606.

Luk et al., "Dielectric Resonator Antennas", Research Studies Press LTD, Hertfordshire, 2003, 404 pgs. (presented in two parts).

Mao et al., "Nanopatterning Using a Simple Bi-Layer Lift-Off Process for the Fabrication of a Photonic Crystal Nanostructure", Nanotechnology, Feb. 1, 2013, vol. 24, No. 8, 6 pgs., doi: 10.1088/0957-4484/24/8/085302.

Mao et al., "Surface Patterning of Nonscattering Phosphors for Light Extraction", Optics Letters, Aug. 1, 2013, vol. 38, No. 15, pp. 2796-2799, doi: 10.1364/OL.38.002796.

McLeod, "Thin-Film Optical Filters", Adam Hilger, 1986, 667 pgs. (presented in three parts).

Miyazaki et al., "Ultraviolet-nanoimprinted packaged metasurface thermal emitters for infrared $CO_2$ sensing", Science and Technology of Advanced Materials, May 20, 2015, vol. 16, No. 3, doi: 10.1088/1468-6996/16/3/035005.

Monticone et al., "Full Control of Nanoscale Optical Transmission with a Composite Metascreen", Physical Review Letters, May 17, 2013, vol. 110, pp. 203903-1-2039035, DOI: 10.1103/PhysRevLett.110.203903.

Mueller et al., "Metasurface Polarization Optics: Independent Phase Control of Arbitrary Orthogonal States of Polarization", Physical Review Letters, Mar. 17, 2017, vol. 118, 113901, 5 pgs.

Ni et al., "Broadband Light Bending with Plasmonic Nanoantennas", Science, Jan. 27, 2012, vol. 335, Issue 6067, 3 pgs., published online Dec. 22, 2011, DOI: 10.1126/science.1214686.

Ni et al., "Ultra-thin, planar, Babinet-inverted plasmonic metalenses", Light Science & Applications, 2013, vol. 2, e72, pp. 1-6, published online Apr. 26, 2013, doi: 10.1038/lsa.2013.28.

Okaya et al., "The Dielectric Microwave Resonator", Proceedings of the IRE, Oct. 1962, vol. 50, Issue 10, pp. 2081-2092, DOI: 10.1109/JRPROC.1962.288245.

Peinado et al., "Optimization and performance criteria of a Stokes polarimeter based on two variable retarders", Optics Express, Apr. 12, 2010, vol. 18, No. 8, pp. 9815-9530.

Pfeiffer et al., "Metamaterial Huygens' Surface: Tailoring Wave Fronts with Reflectionless Sheets", Physical Review Letters, May 10, 2013, vol. 110, pp. 197401-1-197401-5. DOI: 10.1103/PhysRevLett.110.197401.

Pors et al., "Broadband Focusing Flat Mirrors Based on Plasmonic Gradient Metasurfaces", Nano Letters, Jan. 23, 2013, vol. 13, No. 2, pp. 829-834, https://doi.org/10.1021/nl304761m.

Reichelt et al., "Capabilities of diffractive optical elements for real-time holographic displays", Proceedings of SPIE, Feb. 2008, vol. 6912, pp. 69120-69130, pttp://dx.doi.org/10.1117/12.762887.

Rubin et al., "Polarization State Generation and Measurement with A Single Metasurface", Optics Express, Aug. 20, 2018, vol. 26, Issue No. 17, pp. 21455-21478.

Saeidi et al., "Wideband plasmonic focusing metasurfaces", Applied Physics Letters, Aug. 2014, vol. 105, pp. 053107-1-053107-4, http://dx.doi.org/10.1063/1.4892560.

Sales et al., "Diffractive-Refractive Behavior of Kinoform Lenses", Applied Optics, Jan. 1, 1997, vol. 36, pp. 253-257, No. 1, doi: 10.1364/AO.36.000253.

Sancho-Parramon et al., "Optical characterization of HfO2 by spectroscopic ellipsometry: dispersion models and direct data inversion", Thin Solid Films, 2008, vol. 516, pp. 7990-7995, available online Apr. 10, 2008, doi:10.1016/j.tsf.2008.04.007.

She et al., "Large area metalenses: design, characterization, and mass manufacturing", Optics Express, Jan. 22, 2018, vol. 26, No. 2, pp. 1573-1585, doi: 10.1364/OE.26.001573.

Sun et al., "High-Efficiency Broadband anomalous Reflection by Gradient Meta-Surfaces", Nano Letters, 2012, vol. 12, No. 12, pp. 6223-6229, dx.doi.org/10.1021/nl3032668.

Vo et al., "Sub-wavelength grating lenses with a twist", IEEE Photonics Technology Letters, Jul. 1, 2014, vol. 26, No. 13, pp. 1375-1378, DOI: 10.1109/LPT.2014.2325947.

Walther et al., "Spatial and Spectral Light Shaping with Metamaterials", Advanced Materials, 2012, vol. 24, pp. 6300-6304, doi: 10.1002/adma.201202540.

(56) References Cited

OTHER PUBLICATIONS

Wang et al., "Generation of steep phase anisotropy with zero-backscattering by arrays of coupled dielectric nano-resonators", Applied Physics Letters, 2014, vol. 105, pp. 121112-1-121112-5, published online Sep. 25, 2014, https://doi.org/10.1063/1.4896631.

Wu et al., "Spectrally selective chiral silicon metasurfaces based on infrared Fano resonances", Nature Communications, May 27, 2014, vol. 5, No. 3892, pp. 1-9, doi:10.1038/ncomms4892.

Yang et al., "Design of ultrathin plasmonic quarter-wave plate based on period coupling", Optics Letters, 2013, vol. 38, No. 5, pp. 679-681, https://doi.org/10.1364/OL.38.000679.

Yao et al., "Wide Wavelength Tuning of Optical Antennas on Graphene with Nanosecond Response Time", Nano Letters, 2014, First Published Dec. 3, 2013, vol. 14, No. 1, pp. 214-219, doi: 10.1021/nl403751p.

Yu et al., "A Broadband, Background-Free Quarter-Wave Plate Based on Plasmonic Metasurfaces", Nano Letters, Nov. 3, 2012, vol. 12, No. 12, pp. 6328-6333, dx.doi.org/10.1021/nl303445u.

Yu et al., "Flat optics with designer metasurfaces", Nature Materials, Feb. 2014, vol. 13, pp. 139-150, published online Jan. 23, 2014, DOI:10.1038/NMAT3839.

Yu et al., "Flat optics: Controlling wavefronts with optical antenna metasurfaces", IEEE Journal of Selected Topics, 2013, vol. 19, No. 3, 23 pgs.

Yu et al., "Light Propagation with Phase Discontinuities: Generalized Laws of Reflection and Refraction", Science, Oct. 21, 2011, vol. 334, No. 6054, pp. 333-337, doi: 10.1126/science.1210713.

Yu et al., "Quantum cascade lasers with integrated plasmonic antenna-array collimators", Optics Express, Nov. 24, 2008, vol. 16, No. 24, pp. 19447-19461, published online Nov. 10, 2008.

Yu et al., "Small divergence edge-emitting semiconductor lasers with two-dimensional plasmonic collimators", Applied Physics Letters, 2008, vol. 93, pp. 181101-1-181101-3, doi: 10.1063/1.3009599.

Yu et al., "Small-divergence semiconductor lasers by plasmonic collimation", Nature Photonics, Sep. 2008, vol. 2, pp. 564-570, published online Jul. 27, 2008, doi:10.1038/nphoton.2008.152.

Zhao et al., "Mie resonance-based dielectric metamaterials", Materials Today, Dec. 2009, vol. 12, No. 12, pp. 60-69.

Zhao et al., "Twisted Optical metamaterials or planarized ultrathin broadband circular polarizers", Nature Communications, 2012, vol. 3, No. 870, pp. 1-7, DOI: 10.1038/ncomms1877.

Zhou et al., "Characteristic Analysis of Compact Spectrometer Based on Off-Axis Meta-Lens", Applied Sciences, 2018, vol. 8, vol. 321, doi:10.3390/app8030321, 11 pgs.

Zhou et al., "Plasmonic holographic imaging with V-shaped nanoantenna array", Optics Express, Feb. 25, 2013, vol. 21, No. 4, pp. 4348-4354, published online Feb. 12, 2013.

Zhu et al., "Ultra-compact visible chiral spectrometer with meta-lenses", APL Photonics, Feb. 7, 2017, vol. 2, pp. 036103-1-036103-12, 13 pgs., doi: 10.1063/1.4974259.

Zou et al., "Dielectric resonator nanoantennas at visible frequencies", Optics Express, Jan. 14, 2013, vol. 21, No. 1, pp. 1344-1352, published online Jan. 11, 2013.

Extended European Search Report for European Application 17858861.2, Report Completed Mar. 13, 2020, dated Mar. 23, 2020, 9 pgs.

Extended European Search Report for European Application No. 17779772.7, Search completed Oct. 15, 2019, dated Oct. 25, 2019, 10 pgs.

Extended European Search Report for European Application No. 16869282.0, Search completed Nov. 8, 2019, dated Nov. 20, 2019, 15 pgs.

International Preliminary Report on Patentability for International Application PCT/US2018/049276, Report issued on Mar. 3, 2020, dated Mar. 12, 2020, 8 pgs.

International Preliminary Report on Patentability for International Application No. PCT/US2018/038357, Report issued Dec. 24, 2019, dated Jan. 2, 2020, 6 pgs.

International Preliminary Report on Patentability for International Application No. PCT/US2012/053434, Report issued Mar. 4, 2014, dated Mar. 13, 2014, 6 pgs.

International Preliminary Report on Patentability for International Application No. PCT/US2015/064930, Report issued Jun. 13, 2017, dated Jun. 22, 2017, 8 pgs.

International Preliminary Report on Patentability for International Application No. PCT/US2016/063617, Report issued May 29, 2018, dated Jun. 7, 2018, 6 pgs.

International Preliminary Report on Patentability for International Application No. PCT/US2017/026206, Report issued Oct. 9, 2018, dated Oct. 18, 2018, 8 pgs.

International Preliminary Report on Patentability for International Application No. PCT/US2018/031204, Report issued Nov. 5, 2019, dated Nov. 14, 2019, 8 pgs.

International Preliminary Report on Patentability for International Application No. PCT/US2018/035502, Report issued Dec. 3, 2019, dated Dec. 12, 2019, 7 pgs.

International Preliminary Report on Patentability for International Application No. PCT/US2018/046947, Issued Feb. 18, 2020, dated Feb. 27, 2020, 6 pgs.

International Preliminary Report on Patentability for International Application PCT/US2008/084068, Report dated May 25, 2010, 5 pgs.

International Preliminary Report on Patentability for International Application PCT/US2016/052685, Report issued Mar. 27, 2018, dated Apr. 5, 2018, 8 pgs.

International Preliminary Report on Patentability for International Application PCT/US2017/036897, Report issued Dec. 11, 2018, dated Dec. 20, 2018, 8 pgs.

International Preliminary Report on Patentability for International Application PCT/US2017/048469, Report issued Feb. 26, 2019, dated Mar. 7, 2019, 5 pgs.

International Preliminary Report on Patentability for International Application PCT/US2018/034460, Report issued Nov. 26, 2019, dated Dec. 5, 2019, 6 pgs.

International Search Report and Written Opinion for International Application No. PCT/US2012/053434, Search completed Oct. 17, 2012, dated Dec. 17, 2012, 7 pgs.

International Search Report and Written Opinion for International Application No. PCT/US2019/014975, Search completed Jun. 17, 2019, dated Jul. 8, 2019, 10 pgs.

International Search Report and Written Opinion for International Application No. PCT/US2019/018615, Search completed Apr. 12, 2019, dated May 6, 2019, 12 pgs.

International Search Report and Written Opinion for International Application No. PCT/US2019/040302, completed Aug. 29, 2019, dated Oct. 17, 2019, 6 pgs.

International Search Report and Written Opinion for International Application No. PCT/US2020/043600, Search completed Sep. 29, 2020, dated Nov. 24, 2020, 11 pgs.

International Search Report and Written Opinion for International Application No. PCT/US2008/084068, Completed Jan. 13, 2009, dated Feb. 2, 2009, 6 pgs.

International Search Report and Written Opinion for International Application No. PCT/US2015/064930, Search completed Sep. 9, 2016, dated Sep. 20, 2016, 11 pgs.

International Search Report and Written Opinion for International Application No. PCT/US2016/052685, Search completed Nov. 30, 2016, dated Dec. 9, 2016, 12 pgs.

International Search Report and Written Opinion for International Application No. PCT/US2016/063617, Search completed Jan. 19, 2017, dated Mar. 31, 2017, 9 pgs.

International Search Report and Written Opinion for International Application No. PCT/US2017/026206, Search completed Jun. 10, 2017, dated Jun. 28, 2017, 11 pgs.

International Search Report and Written Opinion for International Application No. PCT/US2017/036897, Search completed Jan. 31, 2018, dated Feb. 21, 2018, 9 pgs.

International Search Report and Written Opinion for International Application No. PCT/US2017/048469, Search completed Apr. 20, 2018, dated May 4, 2018, 9 pgs.

(56) References Cited

OTHER PUBLICATIONS

International Preliminary Report on Patentability for International Application PCT/US2020/043600, Report issued Feb. 1, 2022, dated Feb. 10, 2022, 08 Pgs.
Cumme et al., "From Regular Periodic Micro-Lens Arrays to Randomized Continuous Phase Profiles", Adv. Opt. Techn., 2015, vol. 4, No. 1, pp. 47-61.
Dayal et al., "Polarization control of 0.85μm vertical-cavity surface-emitting lasers integrated with gold nanorod arrays", Applied Physics Letters, 2007, vol. 91, pp. 111107-1-111107-3, published online Sep. 12, 2007, DOI: 10.1063/1.2783281.
Dong et al., "Zero-index photonic crystal as low-aberration optical lens (Conference Presentation)", Proc. SPIE 9918, Metamaterials, Metadevices, and Metasystems, Nov. 9, 2016, 991822, available at https://doi.org/10.1117/12.2237137, 1 pg.
Engelberg et al., "Near-IR Wide Field-of-View Huygens Metalens for Outdoor Imaging Applications", CLEO, 2019, 2Pgs.
Martin-Moreno, "Theory of highly directional emission from a single sub-wavelength aperture surrounded by surface corrugations", Physical Review Letters, Apr. 25, 2003, vol. 90, No. 16, 167401, pp. 167401-1-167401-4, published online Apr. 23, 2003, doi:10.1103/PnysRevLett.9.167401.
Orazbayev et al., "Tunable Beam Steering Enabled by Graphene Metamaterials", Optics Express 8848, 2016, vol. 24, No. 8, 14 pgs., DOI:10.1364/OE.24.008848.
Pacheco-Peña et al., "Epsilon-near-zero metalenses operating in the visible", Optics & Laser Technology, Jan. 19, 2016, 80, pp. 162-168.
Petosa et al., "An Overview of Tuning Techniques for Frequency-Agile Antennas", IEEE Antennas and Propagation Magazine, Oct. 2012, vol. 52, pp. 5, pp. 271-296.
Sayyah et al., "Two-dimensional pseudo-random optical phased array based on tandem optical injection locking of vertical cavity surface emitting lasers", Optics Express 19405, Jul. 27, 2015, vol. 23, No. 15, 12 pgs., DO1:10.1364/OE.23.0194051.
Seurin et al., "High-Efficiency VCSEL Arrays for Illumination and Sensing in Consumer Applications", Proc. SPIE 9766, Vertical-Cavity Surface-Emitting Lasers XX, 97660D, Mar. 4, 2016, pp. 97660D-1-97660D-9, doi:10.1117/12.2213295.
Silvestri et al., "Robust design procedure for dielectric resonator metasurface lens array", Optics Express, Dec. 12, 2016, vol. 24, No. 25, 29154, 17 pgs.
Voelkel et al., "Laser Beam Homogenizing: Limitations and Constraints", DPIE, Europe, Optical Systems Design, 2008, 12 pgs.
Wu et al., "Spectrally selective chiral silicon metasurfaces based on infrared Fano resonances", Nature Communications, 2014, vol. 5, No. 3892, published online May 27, 2014, 9 pgs., DOI: 10.1038/ncomms4892.
Zhou et al., "Progress on Vertical-Cavity Surface-Emitting Laser Arrays for Infrared Illumination Applications", Proc. SPIE 9001, Vertical-Cavity Surface-Emitting Lasers Xviii, 90010E, Feb. 27, 2014, 11 pgs., doi: 10.1117/12.2040429.
Birch et al., "3D Imaging with Structured Illumination for Advanced Security Applications", United States: N. p. 2015. Web. doi:10.2172/1221516. https://www.osti.gov/biblio/1221516. 64 pgs.
Li et al., "Metalens-Based Miniaturized Optical Systems", Micromachines, Mar. 31, 2019, vol. 10, No. 301, pp. 1-21.
Roy et al., "Sub-wavelength focusing meta-lens", Optics Express, 2013, vol. 21, pp. 7577-7582.
Wen et al., "Metasurface for characterization of the polarization state of light", Optics Express, 2015, vol. 23, No. 8, pp. 10272-10281.
Extended European Search Report for European Application No. 19830958.5, Search completed Feb. 17, 2022, Mailed Feb. 25, 2022, 8 Pgs.
Extended European Search Report for European Application No. 18852460.7, Search completed Mar. 25, 2021, Mailed Apr. 6, 2021, 13 Pgs.
Extended European Search Report for European Application No. 20847649.9, Search completed Jul. 20, 2023, Mailed Aug. 1, 2023, 11 Pgs.
International Preliminary Report on Patentability for International Application PCT/US2019/040302, Report issued Jan. 5, 2021, Mailed Jan. 14, 2021, 5Pgs.
International Preliminary Report on Patentability for International Application PCT/US2022/070043, Report issued Jul. 4, 2023, Mailed on Jul. 20, 2023, 9 Pgs.
International Search Report and Written Opinion for International Application No. PCT/US2022/070043, Search completed May 5, 2022, Mailed Jun. 9, 2022, 16 Pgs.
International Search Report and Written Opinion for International Application No. PCT/US2022/081868, Search completed Mar. 23, 2023, Mailed Apr. 4, 2023, 13 Pgs.
Arbabi et al., "Efficient Dielectric Metasurface Collimating Lenses for Mid-Infrared Quantum Cascade Lasers", Optics Express, vol. 23, No. 26, Dec. 28, 2015, pp. 33310-33317, https://doi.org/10.1364/OE.23.033310.
Bao et al., "Toward the capacity limit of 2D planar Jones matrix with a single-layer metasurface", Science Advances, Jun. 18, 2021, vol. 7(25), doi: 10.1126/sciadv.abh0365.
Chipman et al., "Polarized Light and Optical Systems", United Kingdom: CRC Press, Aug. 2019.
Chou et al., "Subwavelength amorphous silicon transmission gratings and applications in polarizers and waveplates", Applied Physics Letters, vol. 67, No. 6, Aug. 7, 1995, pp. 742-744, 3 pages.
Herrera-Fernandez et al., "Double Diffractive Optical Element System for Near-Field Shaping", Applied Optics, Aug. 10, 2011, vol. 50, Issue 23, pp. 4587-4593.
Hsiao et al., "Fundamentals and Applications of Metasurfaces", Small Methods, Mar. 24, 2017, 1, 1600064, 20 pgs.
Jang et al., "Wavefront Shaping with Disorder-Engineered Metasurfaces", Nature Photonics, 2018, vol. 12, 8 pages.
Karagodsky et al., "Monolithically Integrated Multi-Wavelength VCSEL Arrays using High-Contrast Gratings", Optics Express, Jan. 5, 2010, vol. 18, Issue 2, pp. 694-699, https://doi.org/10.1364/OE.18.000694.
Lee et al., "Giant Nonlinear Response from Plasmonic Metasurfaces Coupled to Intersubband Transitions", Nature, Jul. 3, 2014, vol. 511, 11pgs.
Li et al., "All-Silicon Nanorod-Based Dammann Gratings", Optics Letters, Sep. 15, 2015, vol. 40, Issue 18, pp. 4285-4288.
Li et al., "Broadband Diodelike Asymmetric Transmission of Linearly Polarized Light in Ultrathin Hybrid Metamaterial", Applied Physics Letters, Nov. 19, 2014, 105, 201103; doi: 10.1063/1.4902162.
Lim et al., "Self-Mixing Imaging Sensor Using a Monolithic VCSEL Array with Parallel Readout", Optics Express, vol. 17, No. 7, Mar. 30, 2009, pp. 5517-5525.
Liu et al., "Single-Pixel Computational Ghost Imaging with Helicity-Dependent Metasurface Hologram", Sci, Adv. Sep. 8, 2017, vol. 3, E1701477.
Liu et al., "Ssd: Single shot multibox detector", European conference on computer vision. Springer, Cham, 2016.
Mackus et al., "The Use of Atomic Layer Deposition in Advanced Nanopatterning", Nanoscale, Jul. 25, 2014, 6, 10941, 20pgs.
Martin-Regalado et al, "Polarization Properties of Vertical-Cavity Surface-Emitting Lasers", IEEE Journal of Quantum Electronics, vol. 33, No. 5, May 1997, pp. 765-783, doi: 10.1109/3.572151.
Meng et al., "A Novel Nanofabrication Technique of Silicon-Based Nanostructures", Nanoscale Research Letters 11(1):504, 9pgs. DOI:10.1186/s11671-016-1702-4.
Pfeiffer et al., "Cascaded Metasurfaces for Complete Phase and Polarization Control", Applied Physics Letters, vol. 102, Article 231116, 2013, 5 pgs., doi: 10.1063/1.4810873.
Redding et al., "Full-Field Interferometric Confocal Microscopy using a VCSEL Array", Opt Lett. Aug. 1, 2014, vol. 39, No. 15, pp. 4446-4449.
Rubin et al., "Matrix Fourier optics enables a compact full-Stokes polarization camera", Science, Jul. 5, 2019, vol. 365, Issue 6448, 10 pgs., DOI: 10.1126/science.aax1839.

(56) References Cited

OTHER PUBLICATIONS

Schulz et al., "Quantifying the Impact of Proximity Error Correction on Plasmonic Metasurfaces", Optical Materials Express, published Nov. 10, 2015, vol. 5, Issue 12, pp. 2798-2803.
Sell et al., "Periodic Dielectric Metasurfaces with High-Efficiency, Multiwavelength Functionalities", Advanced Optical Materials, Dec. 1, 2017, vol. 5, No. 23, 16 pgs., DOI: 10.1002/adom.201700645.
Shi et al., "Continuous angle-tunable birefringence with freeform metasurfaces for arbitrary polarization conversion", Science Advances, Jun. 3, 2020, vol. 6(23), doi: 10.1126/sciadv.aba3367.
Sokolov, "Polarization of Spherical Waves", Optics and Spectroscopy, Jan. 2002, vol. 92(6), pp. 936-942.
Song et al., "Vividly-Colored Silicon Metasurface Based on Collective Electric and Magnetic Resonances", 11th Conference on Lasers and Electro-Optics Pacific Rim, Jan. 11, 2016, 2 pgs.
Su et al., "Designing LED Array for Uniform Illumination Distribution by Simulated Annealing Algorithm", Optics Express, vol. 20, No. S6, Nov. 5, 2012, pp. A843-A855.
Wang et al., "Information authentication using an optical dielectric metasurface", Journal of Physics D: Applied Physics, Institute Of Physics Publishing, Bristol, GB, Aug. 17, 2017, vol. 50, No. 36, XP020319491.
Xu et al., "Metasurface Quantum-Cascade Laser with Electrically Switchable Polarization", Optica, vol. 4, No. 4, Apr. 2017, pp. 468-475.
Xu et al., "Metasurface External Cavity Laser", Applied Physics Letters, vol. 107, Article 221105, 2015, 6 pgs., doi: 10.1063/1.4936887.
Yang et al., "Generalized Hartmann-Shack array of dielectric metalens sub-arrays for polarimetric beam profiling", Nature Communications, Nov. 2, 2018, vol. 9, No. 907, 7 pgs, DOI: 10.1038/s41467-018-07056-6.
Yu et al., "Optical Metasurfaces and Prospect of their Applications Including Fiber Optics", Journal of Lightwave Technology, 2015, vol. 33, No. 12, pp. 2344-2358, DOI: 10.1109/JLT.2015.2404860.
Zhang et al., "High efficiency all-dielectric pixelated metasurface for near-infrared full-Stokes polarization detection", Photonics Research, vol. 9, No. 4, Apr. 2021, pp. 583-589, https://doi.org/10.1364/PRJ.415342.
Arbabi et al., "Full-Stokes Imaging Polarimetry Using Dielectric Metasurfaces", ACS Photonics, Jul. 16, 2018, vol. 5, No. 8, pp. 3132-3140.
Capaldo et al., "Nano-Fabrication and Characterization of Silicon Meta-Surfaces Provided with Pancharatnam-Berry effect", Optical Materials Express, Mar. 1, 2019, vol. 9, No. 3, p. 1015-1032.
Juan et al., "Arbitrary Polarization Transformation Based on Two-Dimensional Metallic Rectangular Gratings", Acta Optica Sinica, Dec. 31, 2011, vol. 31, No. 12, 1224001-1-1224001-5.
Sreelal et al., "Jones Matrix Microscopy from a Single-Shot Intensity Measurement", Optics Letters, Dec. 15, 2017, vol. 42, Issue 24, pp. 5194-5197.
Gutiérrez-Vega, "Optical phase of inhomogeneous Jones matrices: retardance and ortho-transmission states", Optics Letters, 2020, vol. 45(7), pp. 1639-1642, doi: 10.1364/OL.387644.
Lu et al., "Homogeneous and Inhomogeneous Jones Matrices", Journal of the Optical Society of America A, 1994, vol. 11(2), pp. 766-773.
Yun et al., "Skew Aberration: a Form of Polarization Aberration", Optics Letters, 36(20), pp. 4062-4064, doi: 10.1364/OL.36.004062.

\* cited by examiner

Image sensor dimensions

Rectangular metasurface dimensions
l = h + f/N
w = v + f/N

APERTURE-METASURFACE AND HYBRID REFRACTIVE-METASURFACE IMAGING SYSTEMS

CROSS-REFERENCE TO RELATED APPLICATIONS

This application claims priority to U.S. Provisional Patent Application No. 62/878,962, filed Jul. 26, 2019, the disclosure of which is incorporated herein by reference.

FIELD OF THE INVENTION

The current disclosure is directed to optical arrangements of metasurface elements, integrated systems incorporating refractive optics, light sources and/or detectors with such metasurface elements, and methods of the manufacture of such optical arrangements and integrated systems.

BACKGROUND OF THE INVENTION

Metasurface elements are diffractive optics in which individual waveguide elements have subwavelength spacing and have a planar profile. Metasurface elements have recently been developed for application in the UV-IR bands (300-10,000 nm). Compared to traditional refractive optics, metasurface elements abruptly introduce phase shifts onto light field. This enables metasurface elements to have thicknesses on the order of the wavelength of light at which they are designed to operate, whereas traditional refractive surfaces have thicknesses that are 10-100 times (or more) larger than the wavelength of light at which they are designed to operate. Additionally, metasurface elements have no variation in thickness in the constituent elements and thus are able to shape light without any curvature, as is required for refractive optics. Compared to traditional diffractive optical elements (DOEs), for example binary diffractive optics, metasurface elements have the ability to impart a range of phase shifts on an incident light field, at a minimum the metasurface elements can have phase shifts between $0$-$2\pi$ with at least 5 distinct values from that range, whereas binary DOEs are only able to impart two distinct values of phase shift and are often limited to phase shifts of either 0 or $1\pi$. Compared to multi-level DOE's, metasurface elements do not require height variation of its constituent elements along the optical axis, only the in-plane geometries of the metasurface element features vary.

BRIEF SUMMARY OF THE INVENTION

The application is directed to optical arrangements of metasurface elements, integrated systems incorporating light sources and/or detectors with such metasurface elements, and methods of the manufacture of such optical arrangements and integrated systems.

Many embodiments are directed to imaging system including:
- at least one image sensor;
- a substrate layer having a substrate thickness disposed above the at least one image sensor by a first distance, the substrate layer configured to be transparent to a target wavelength of light, the substrate layer having a first surface distal the at least one image sensor and a second surface proximal the at least one image sensor;
- an aperture disposed on the first surface of the substrate and having an aperture opening disposed therein; and
- a single layer of a plurality of identical or unique nanostructured elements comprising a metasurface disposed on the second surface, such that light impinging on the aperture opening passes through at least a portion of the metasurface such that a specified angular deflection is imposed thereby;
- wherein the distance between the aperture and the layer of metasurface elements are separated by a second distance determined by the substrate thickness; and
- wherein the aperture and the layer of metasurface elements are configured to gather light of a specified operational bandwidth across a specified field of view and shift the incoming light such that it comes to a focus on the at least one image sensor at a zero or near-zero degree chief ray angle.

In still many embodiments, the system further includes a glass cover disposed atop the at least one image sensor.

In yet many the first distance is determined by a spacing layer comprised of one of either a solid-state spacer material or an air gap.

In still yet many embodiments, the field of view is at least ±30 degrees.

In yet still many embodiments, the system further includes a narrow bandwidth optical filter disposed between the metasurface elements and the at least one image sensor Various embodiments are directed to an imaging system including:
- at least one image sensor;
- a substrate layer having a substrate thickness, the substrate layer configured to be transparent to a target wavelength of light, the substrate layer having a first surface distal the at least one image sensor and a second surface proximal with the at least one image sensor;
- an aperture disposed above the substrate and having an aperture opening disposed therein; and
- a single layer of a plurality of identical or unique nanostructured elements comprising a metasurface disposed on one of either the first or second surfaces, such that light impinging on the aperture opening passes through at least a portion of the metasurface such that a specified angular deflection is imposed thereby;
- wherein the distance between the aperture and the metasurface layer are separated by a first distance; and
- wherein the aperture and the metasurface layer are configured to gather light of a specified operational bandwidth across a specified field of view and shift the incoming light such that it focuses on the at least one image sensor at a zero or near-zero degree chief ray angle.

In still various embodiment, the system further includes an airgap between the second surface of the substrate and the image sensor.

In yet various embodiments, a spacer layer is disposed within the airgap.

In still yet various embodiments, the metasurface layer is disposed on the first surface.

In still yet various embodiments, the system further includes a narrow bandwidth optical filter disposed on the second surface between the metasurface elements and the at least one image sensor.

In yet still various embodiments, at least a portion of the aperture is interconnected with the first surface.

In still yet various embodiments, the metasurface layer is disposed on the second surface.

In yet still various embodiments, the image sensor is in contact with the second surface.

In still yet various embodiments, the field of view is at least ±30 degrees.

Several embodiments are directed to an imaging system including:
- at least one image sensor;
- substrate layer having a substrate thickness, the substrate layer configured to be transparent to a target wavelength of light, the substrate layer having a first surface distal the at least one image sensor and a second surface proximal with the at least one image sensor;
- at least one refractive lens disposed above the substrate and configured to focus impinging light on the first surface of the substrate layer; and
- a single layer of a plurality of identical or unique nanostructured elements comprising a metasurface disposed on one of either the first or second surfaces, such that light impinging on the at least one refractive lens passes through at least a portion of the metasurface elements such that an angular deflection is imposed thereby;
- wherein the distance between the at least one refractive lens and the layer of metasurface elements are separated by a first distance; and
- wherein the refractive lens and the layer of metasurface elements are configured to gather light of a specified operational bandwidth across a specified field of view and shift the incoming light such that it focuses on the at least one image sensor at a zero or near-zero degree chief ray angle.

In still several embodiments, the system further includes an airgap between the second surface of the substrate and the image sensor.

In yet several embodiments, a spacer layer is disposed within the airgap.

In still yet several embodiments, the metasurface layer is disposed on the first surface.

In yet still several embodiments, the system further includes a narrow bandwidth optical filter disposed on the second surface between the metasurface elements and the at least one image sensor.

In still yet several embodiments, at least a portion of at least one of the refractive lenses is interconnected with the first surface.

In yet still several embodiments, the metasurface layer is disposed on the second surface.

In still yet several embodiments, the image sensor is in contact with the second surface.

In yet still several embodiments, the field of view is at least ±30 degrees.

In still yet several embodiments, the at least one refractive lens is selected from the group consisting of plano-convex, convex-plano, bi-convex, bi-concave, plano-concave, or concave-plano.

In yet still several embodiments, the system includes at least two refractive lenses comprising a convex-concave lens and concave-convex lens.

In still yet several embodiments, the system includes at least three refractive lenses comprising a convex-concave lens, a bi-convex lens and a concave-plano lens.

In various of the above embodiments, at least the imaging sensor and metasurface have rectangular geometries.

In still various of the above embodiments, the at least one refractive lense proximal to the metasurface has a circular geometry.

In yet various of the above embodiments, the image sensor is characterized by a vertical, v, and a horizontal, h, dimension, and wherein the at least one refractive lens is characterized by the f-number of the lens, N, defined as $N = f/D$ where f is the focal length of the optical system and D is the diameter of the lens, and wherein a metalense lens width is given by: $=v+f/N$, and wherein a metalense length l given by: $l=h+f/N$.

Additional embodiments and features are set forth in part in the description that follows, and in part will become apparent to those skilled in the art upon examination of the specification or may be learned by the practice of the disclosure. A further understanding of the nature and advantages of the present disclosure may be realized by reference to the remaining portions of the specification and the drawings, which forms a part of this disclosure.

BRIEF DESCRIPTION OF THE DRAWINGS

The description will be more fully understood with reference to the following figures, which are presented as exemplary embodiments of the invention and should not be construed as a complete recitation of the scope of the invention, wherein.

DETAILED DESCRIPTION OF THE INVENTION

Figure 1:
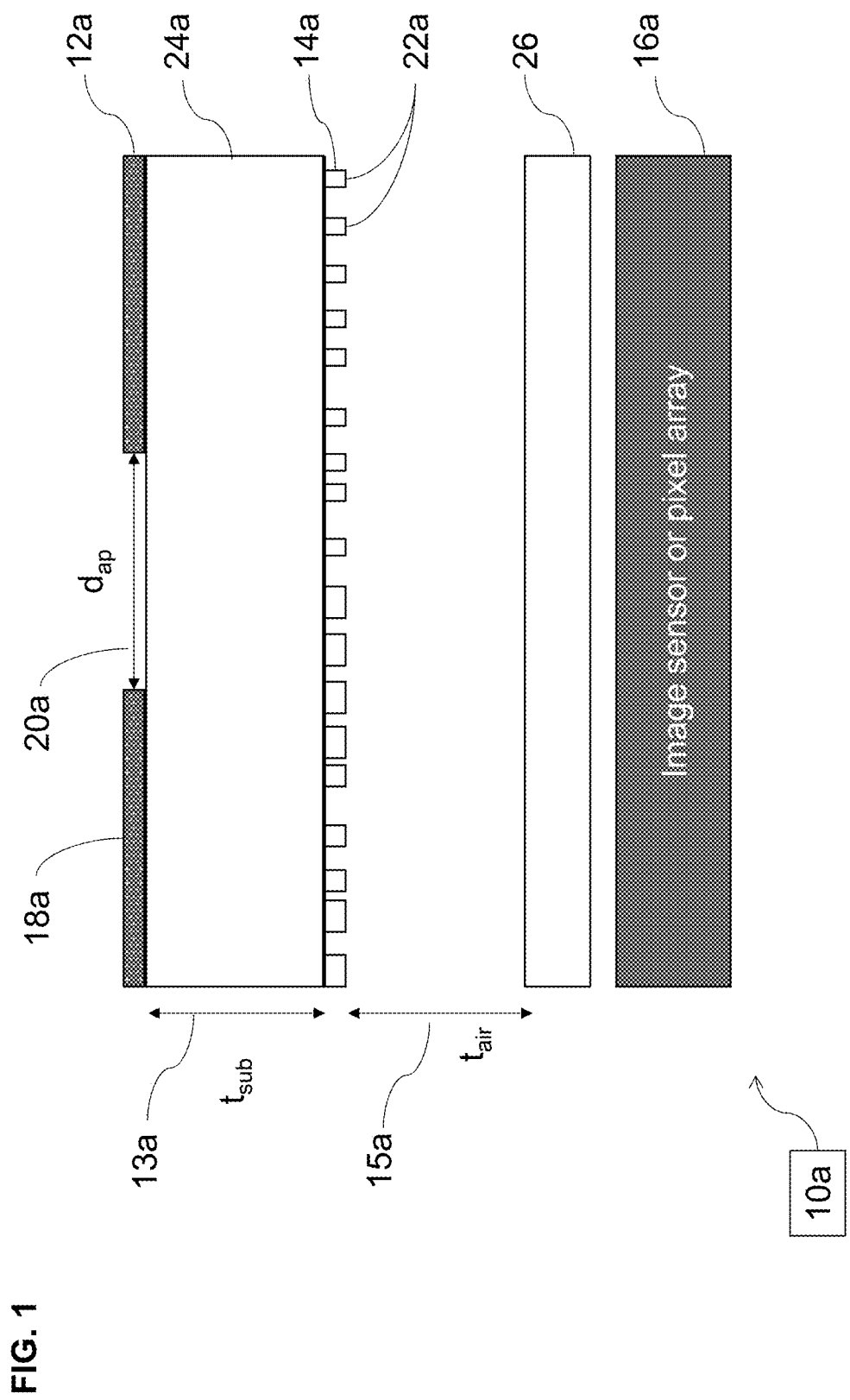
FIG. 1 provides a schematic illustrating an aperture-metasurface imaging system incorporating a cover glass above the image sensor in accordance with embodiments of the invention.

Turning now to the drawings, hybrid imaging systems incorporating conventional optical elements and metasurface elements with light sources and/or detectors, and methods of the manufacture and operation of such optical arrangements are provided. Many embodiments are directed to systems and methods for integrating apertures with metasurface elements in illumination sources and sensors. Various embodiments, are directed to systems and methods for integrating refractive optics with metasurface elements in illumination sources and sensors.

Embodiments of many optical imaging systems may incorporate a single aperture and single metasurface layer operable to correct for aberrations over a large field of view. Many embodiments of such single aperture and metasurface imaging systems are configured to be telecentric (e.g., having a near 0 degree angle of incidence at image sensor plane) over large field of view such that there is no fall-off in relative illumination over the field of view (e.g., that the intensity from on-axis rays is nearly identical to the intensity at the edge of the field-of-view).

In many embodiments, hybrid refractive optic and metasurface imaging systems may comprise metasurface elements that are free-standing (i.e., not directly integrated with a specific illuminator or sensor into a system). In some embodiments, the optical system may consist of a single physical component or substrate having a metasurface element disposed on either side thereof. In some embodiments, multiple refractive optics may be combined with at least one metasurface element to make more complex systems.

In embodiments of hybrid aperture or refractive optic and metasurface imaging systems the metasurface may be disposed on a surface of a supporting substrate either facing the aperture or facing the imaging system. In various embodiments airgaps may be disposed between the aperture and metasurface structure and/or between the metasurface substrate and the imaging system. Airgaps between elements may further comprise spacer structures to provide support therefor.

In many embodiment, the metasurface element may be free standing or may be embedded within another material. In various such embodiments, the selection of the embedding material includes the appropriate selection of refractive index and absorption characteristics. In many such embodiments, the embedding material may provide mechanical stability and protection as well as an additional design degree of freedom that enables the metasurface to perform a desired optical function.

In some embodiments, a spacing layer of a defined thickness (e.g., the working distance) may be deposited on the CMOS image sensor, LED, VCSEL, etc., to implement an optical distance appropriate for a desired camera design, illuminator design or optimal system performance. In various such embodiments, the spacing layer material may be organic or inorganic and may have a lower refractive index than the dielectric elements comprising the metasurface. In some such embodiments, the thickness of the spacing layer may be modified to provide appropriate optical spacing for the specific optical system.

Various embodiments are also directed to methods of fabricating hybrid metasurface imaging systems. In some such embodiments, methods are directed to the manufacture of metasurface elements on a wafer incorporating other devices, such as sensors or illuminators, thereby avoiding, in some embodiments, expensive manufacturing processes, such as, for example, the mechanical assembly of small dimension elements, or the active alignment of optics with sensors. In some such embodiments, metasurface elements may be integrated with the sensor (or the illuminator) in a series of operations at a semiconductor fab. In many such embodiments a sequence may include: (i) sensor or illuminator, (ii) optional microlens array/collimator, optional filter, optional spacing layer, optional metasurface element, optional additional spacing layer, optional refractive optic or aperture elements, optional anti-reflection (AR) layer, optional protection layer. In many such embodiments a sequence of elements may include: (i) sensor or illuminator, (ii) optional microlens array/collimator, optional filter, optional spacing layer, optional metasurface element, optional additional spacing layer, and optional refractive element or aperture.

Embodiments for Implementing Aperture/Metasurface Imaging Systems

Typically to form an optical system that is corrected for aberrations over a selected field of view, the system must comprise multiple optical surface or multiple optical elements (e.g., two or more). This is true for both conventional refractive optical systems and metasurface optical systems. Specifically, only optical systems with two or more metasurfaces and sufficiently low aberrations over some field of view have been demonstrated. Various embodiments are directed to imaging systems that integrate an aperture and a single metasurface element, that allow for the combined system to achieve high quality imaging over a large field of view, telecentricity (e.g., near 0 degree of incidence at the image sensor plane) over a large field of view, and with no fall-off in relative illumination.

Specifically, such systems may be used in imaging systems such as CMOS cameras, (such as those used in cell phones, computers, tablets etc., for collecting images of a scene of visible light or in the infrared for biometric authentication). These CMOS imaging systems require an increased field-of-view (FOV), independent control of the chief ray angle (CRA) as a function of field height at the CMOS image sensor, and minimal optical distortion of the scene being imaged. These terms will be understood to have a meaning conventional to those skilled in the art. For traditional imaging systems, comprised of refractive lenses, as many as five or six unique lenses must be combined to perform this function. Similarly, in conventional metasurface imaging systems implement multiple metasurface elements to provide enough degrees of freedom to adequately control these parameters (CRA, FOV and minimizing distortion). However, various embodiments show that by combining an aperture with a single metasurface, an imaging system with a wide FOV, controllable distortion and controllable CRA can be realized in accordance with embodiments.

An exemplary embodiment of such a system is illustrated in FIGS. 1 to 7. As shown, in many such embodiments the system (10a to 10d) generally comprises an aperture structure (12a to 12d) disposed a set distance (13a to 13d) away from a metasurface layer (14a to 14d), which itself is set a distance (15a to 15d) away from an image sensor (16a to 16d). As will be described in greater detail below, in such systems it will be understood that the distance between the aperture and metasurface layer, and the distance between the metasurface layer and the imaging system (e.g., the back focal length of the imaging system) may take the form of an air gap or an optically transmissive material (e.g., substrate etc.).

For the purposes of many embodiments, the aperture structure (12a to 12d) comprises a first aperture structure portion (18a to 18d) which is opaque to light at the wavelength of interest and a second aperture structure portion (20a to 20d) that is completely transparent to light at the wavelength of interest over a distance ($d_{ap}$). In various embodiments such aperture structures impart no optical function (e.g., does not deflect light rays) but rather limits the lateral extent of a light ray bundle entering the imaging system, or otherwise equivalently sets the entrance aperture of the imaging system.

For purposes of many embodiments, the metasurface layer (14a to 14e) generally comprises a plurality of nanostructures (22a to 22e) disposed on a substrate (24a to 24e) defined by a substrate thickness ($t_{sub}$) which may be formed of any material transparent at the wavelength of interest. In many embodiments of hybrid aperture/metasurface imaging systems, the metasurface layer is the only functional layer provided that significantly deflects incident light rays to form a focused image (e.g., the metasurface layer operates as an arbitrary phase mask).

Embodiments of nanostructures generally comprise identical or unique three dimension elements (e.g., square, round, triangular, oval, etc.) having feature sizes smaller than the wavelength of light within the specified operational bandwidth and configured to impose a phase shift on impinging light within the plane of plurality separated by macroscopic distances (distances of 10 or more wavelengths), such that in combination the metasurface layer performs a single optical function. Each individual metasurface in the optical system, may be configured to have some specific 2D phase and transmission function, $\phi(x,y)$ and $t(x,y)$, that it carries out. While in general each metasurface may have a unique distribution of phase and transmission, the nanostructure elements that comprise any metasurface embedded in the same material, with the same base composition and at a specific wavelength are identical. In most practical single wavelength applications, the transmission can be configured to be maximized (near 1) and uniform across the metasurface while the phase can be configured to take on values between 0 and $2\pi$. In summary, according to embodiments, for some wavelength of interest, material system (metasurface material and embedding material), fixed thickness and element spacing, a set of in-plane dimensions of the comprising nanostructures may be configured such that phase delays from 0 to $2\pi$ can be imprinted on an incident light field. Thus for different implementations of metasurface designs at the fixed material and wavelength conditions, the only variable from design to design is the distribution of suitable nanostructure elements across the metasurface.

Metasurface layers according to some embodiments may be designed to be freestanding, i.e., the metasurface elements protrude from the end of the substrate with only air gaps separating them, the process is complete at this step. In other embodiments metasurfaces may be further configured to have an AR coating or mechanical protection. In some such embodiments, in order to protect the metasurface and provide improved functionality, the metasurface constituent elements and substrate faces may be coated in some material or layers of material. In embodiments with embedded metasurface elements, the elements, which can be any material with desired optical properties, are embedded in a lower-index of refraction medium. The low-index medium completely encapsulates the metasurfaces and extends some thickness above the metasurface elements. The low-index medium acts as a protective barrier to the metasurface elements (i.e., provide mechanical stability) and provides an additional design degree of freedom for the system that allows for certain properties to be optimized, e.g., overall transmission or efficiency of the metasurface.

Metasurface layers or metasurface systems according to embodiments can be fabricated in mass production using any suitable fabrication techniques, including, for example, lithography, machining, etching, and standard CMOS fabrication techniques, as has been previously described in U.S. patent application Ser. No. 16/120,174, filed Aug. 31, 2018, the disclosure of which is incorporated herein by reference. The metasurface substrate may be any low-index material, e.g., polymer, $SiO_2$, glass. The metasurface elements may also be any material which has been optimized for a specific bandwidth, e.g., silicon, $TiO_2$, alumina, metal, etc.

The imaging system may take the form of a single monolithic image sensor or a pixel array. Such image sensors and pixel arrays may take any suitable form including, for example, CMOS sensors.

FIG. 1 provides a schematic illustration of an implementation of various embodiments of such hybrid aperture/metasurface imaging systems. As shown, in many embodiments a substrate layer (24a) transparent at the wavelength of interest and having a thickness ($t_{sub}$) is provided having an aperture structure (12a) which is opaque to light at the wavelength of interest and completely transparent to light at that wavelength of interest over a distance, ($d_{ap}$) disposed on a first side distal to the imager (16a), and a metasurface layer (14a) composed of nanostructures (22a) with equal height disposed on a second side proximal to the imager (16a). In such embodiments the aperture structure (12a) and metasurface layer (14a) are separated by a first distance (13a) defined by the substrate thickness ($t_{sub}$). Further in such embodiments, the aperture structure (12a) and metasurface layers (14a) may be deposited directly on the substrate (24a) or bonded via adhesive. Between the metasurface layer (14a) and the imager (16a) is disposed a distance (15a) defining the back-focal length formed by an air gap ($t_{air}$). Although not required, many embodiments of such imaging systems may further comprise an optional cover glass or filter (26) which does not impact the imaging performance of the device but provides other functionality (e.g., either optical or structural).

It will be understood that in such embodiments, the aperture imparts no optical function (does not deflect the light rays) but rather only limits the lateral extent of the light ray bundle that may enter the imaging system, or equivalently sets the entrance aperture or the f/#of the system. Meanwhile, the metasurface layer may comprise the only functional optical layer that significantly deflects the light rays to form a focused image in such embodiments. In some such embodiments, the metasurface layer may act as an arbitrary phase mask, imparting any value from 0 to 2πc phase shift on the incident light at an arbitrary radial position of the lens.

Figure 2:
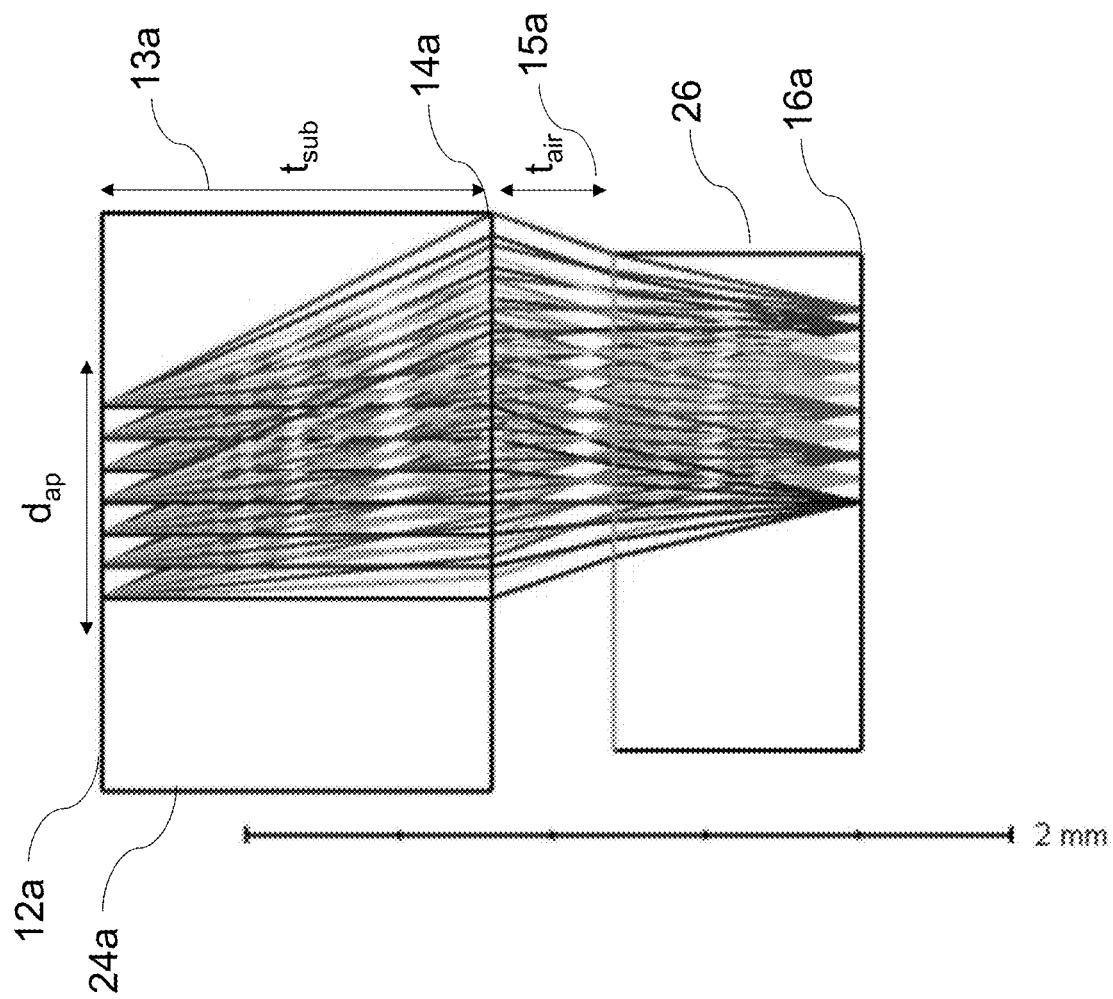
FIG. 2 provides a schematic illustrating a ray tracing diagram including the chief ray angle at the image sensor plane for the aperture-metasurface imaging system of FIG. 1 in accordance with embodiments of the invention.

Referring to FIG. 2, a ray-tracing diagram through an exemplary embodiment of a system comprising a single aperture (12a) and a single metasurface (14a) combined on a single substrate (24a) in accordance with the embodiment illustrated in FIG. 1 is provided. (Although not described in detail here, it will be understood that these metasurface elements could be fabricated using methods as described herein or in previously cited U.S. patent application Ser. No. 16/120,174 using a suitable conformal deposition process, such as, for example, low pressure chemical vapor deposition or atomic layer deposition.) In this exemplary embodiment, the aperture and metasurface elements have been configured such that in combination they are able to form a good image across a wide FOV (±40 degrees in this example, however, it will be understood that this is not a limiting case). Embodiments of such a single aperture and single metasurface system, as shown, have been surprisingly found to naturally produce focused rays at the image plane that are telecentric (i.e., having 0 degree CRA). In short, while traditional refractive and metasurface designs require complex, many-element systems to realize such telecentric designs, in accordance with embodiments only a single aperture and single metasurface element are needed to achieve similar telecentricity. This telecentricity in turn leads to improved optical properties. In particular, the low (e.g., zero or near zero degree CRA) allows for a narrowing of the bandwidth of the optical filter (26) for narrowband applications. In traditional refractive designs, especially for compact mobile applications, CRAs in are typically on the order of 15 degrees to 30 degrees. These larger CRAs in turn require the filter bandwidth to be significantly increased allowing for more ambient light to enter the detector. In narrowband applications (e.g., a near IR VCSEL array), such ambient light can be a persistent noise source. Thus, embodiments of a combined metasurface/filter system such as that shown in FIG. 2 allow for better ambient light performances.

Figure 3:
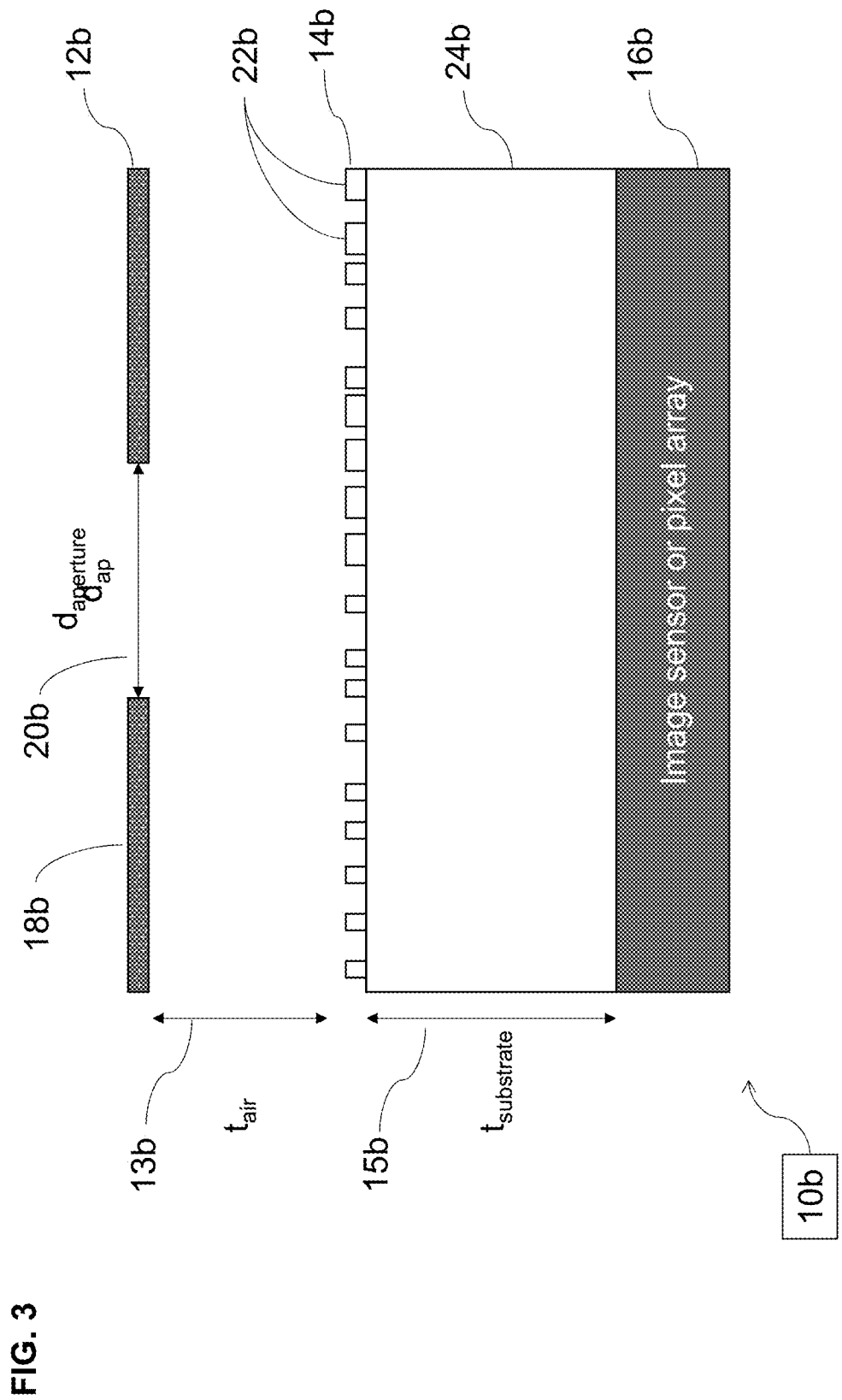
FIG. 3 provides a schematic illustrating an aperture-metasurface imaging system with an air gap between the aperture and metasurface in accordance with embodiments of the invention.

Although FIGS. 1 and 2 provide one arrangement of optical elements for a hybrid aperture/metasurface imaging system, it will be understood that many other arrangements of elements may be realized. For example, FIG. 3 provides a schematic illustration of embodiments of imaging systems in which the position of the airgap and substrate have been exchanged. Such a structure allows for the formation of a thinner imaging system, but entails a more complicated assembly process. In particular, as shown in FIG. 3, such imaging system embodiments comprise a substrate (24b) transparent at the wavelength of interest and having a thickness ($t_{sub}$) provided having a metasurface layer (14b) composed of nanostructures (22b) with equal height disposed on a first side distal to the imager (16b), and on a second side the imager (16b). In such embodiments, the metasurface layers (14b) and the imager (16b) may be directly bonded via adhesive or other suitable means. Between the metasurface layer (14b) and the imager (16b) is disposed a distance (15b) defining the back-focal length formed by the substrate thickness ($t_{sub}$). This distance is used as a free parameter to design imaging systems with optimal performance and will change based on the desired f/#or field of view of the imaging system, for example. In such embodiments such imaging systems do not require the optional cover glass or filter used in the embodiment shown in FIG. 1 as the substrate (24b) provides such dual functionality. In such embodiments the aperture structure (12b), which is opaque to light at the wavelength of interest and completely transparent to light at that wavelength of interest over a distance, ($d_{ap}$), and metasurface layer (14b) are separated by a first distance (13b) defined by and airgap ($t_{air}$).

Figure 4:
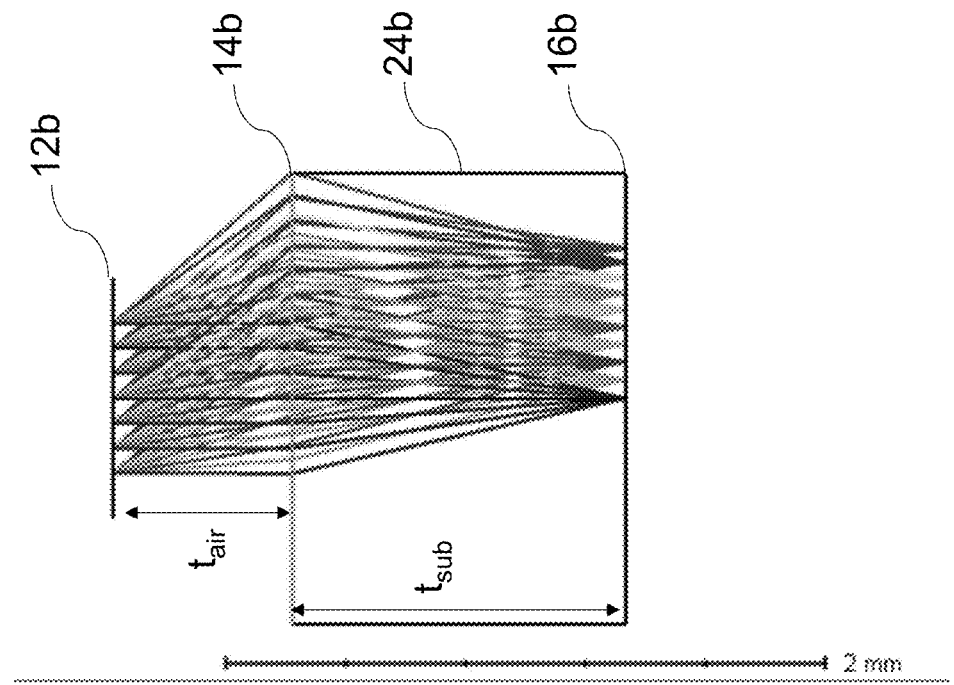
FIG. 4 provides a schematic illustrating a ray tracing diagram including the chief ray angle at the image sensor plane for the aperture-metasurface imaging system of FIG. 3 in accordance with embodiments of the invention.

Referring to FIG. 4, a ray-tracing diagram through an exemplary embodiment of a system comprising a single aperture (12b), along with a single metasurface (14b) and an imager (16b) combined on a single substrate (24b) in accordance with the embodiment illustrated in FIG. 3 is provided. (Although not described in detail here, it will be understood that these metasurface elements could be fabricated using methods as described herein or in previously cited U.S. patent application Ser. No. 16/120,174 using a suitable conformal deposition process, such as, for example, low pressure chemical vapor deposition or atomic layer deposition.) In this exemplary embodiment, the aperture and metasurface elements have been configured such that in combination they are able to form a good image across a wide FOV (±40 degrees in this example, however, it will be understood that this is not a limiting case). Embodiments of such a single aperture and single metasurface system, as shown, have been surprisingly found to naturally produce focused rays at the image plane that are telecentric (i.e., having 0 degree CRA).

Although FIGS. 1 and 4 provide arrangements of optical elements for a hybrid aperture/metasurface imaging system in which an element is in direct contact with the image sensor, it will be understood that many other arrangements of elements incorporating spacers disposed between the image sensor and the substrate supporting the metasurface layer may be realized. For example, FIG. 5 provides a schematic illustration of embodiments of imaging systems in which a second airgap (28) is disposed within the imaging system.

Figure 5:
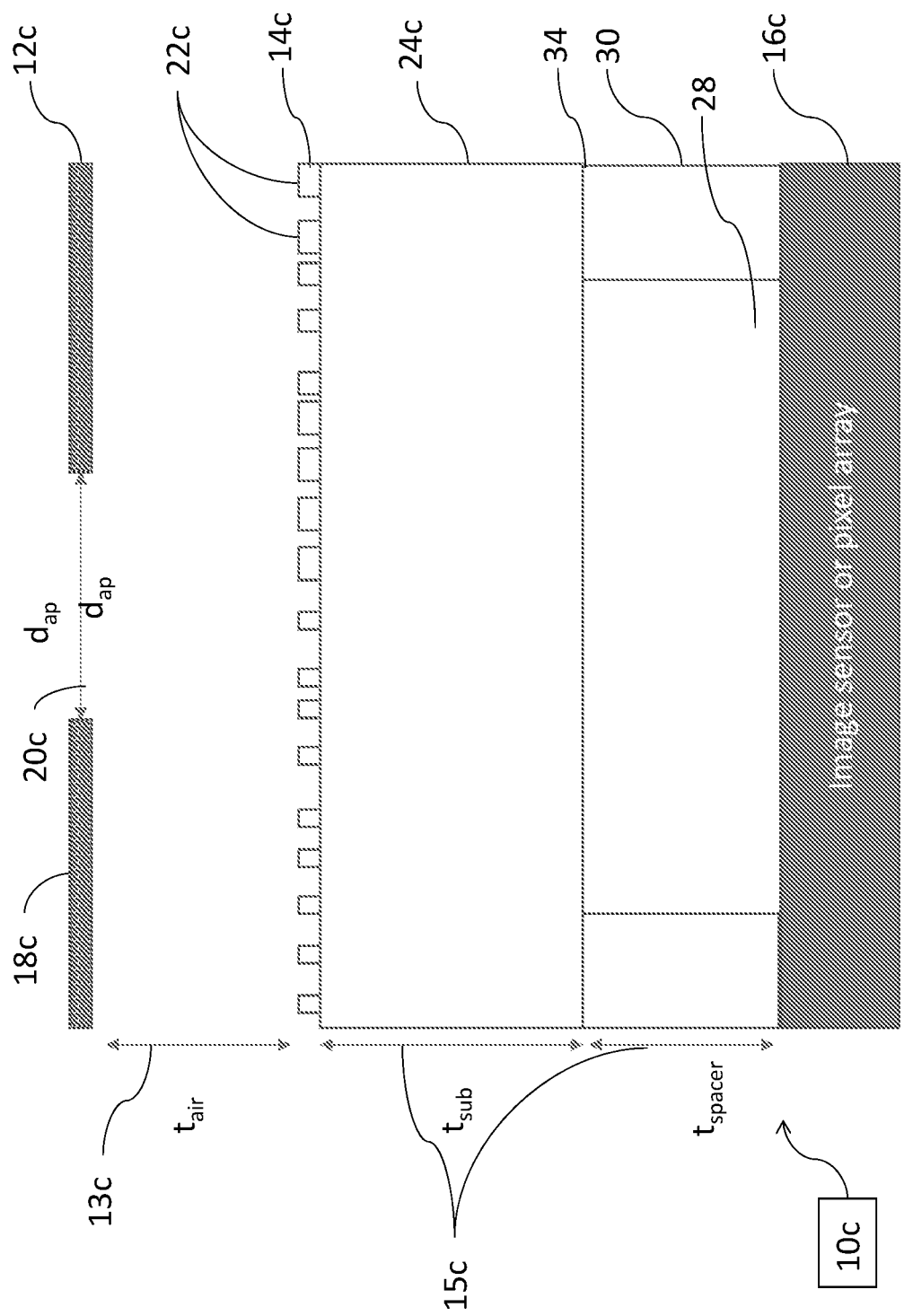
FIG. 5 provides a schematic illustrating an aperture-metasurface imaging system incorporating an air gap above the image sensor and the metasurface layer closer to the object plane in accordance with embodiments of the invention.

In particular, as shown in FIG. 5, such imaging system embodiments comprise a substrate (24c) transparent at the wavelength of interest and having a thickness ($t_{sub}$) provided having a metasurface layer (14c) composed of nanostructures (22c) with equal height disposed on a first side distal to the imager (16c), and a second airgap (28) disposed between a second side of the metasurface layer proximal to the imager (16c). One advantage of such embodiments incorporating an air gap is that the light rays proceed through the system at higher angle, as compared to the embodiment shown in FIG. 1, for example, thus allowing for a decrease in the overall form factor of the metasurface optical system. In addition, the gap between the metasurface substrate and image sensor alloys for the introduction of other optical elements, including, for example, microlens arrays or optical color filters to improve optical function of the imaging system.

In such embodiments, the metasurface layers (14c) and the imager (16c) may be deposited directly on the substrate (24c) or bonded via adhesive. Such embodiments may also comprise suitable spacers (30) to support the substrate (24c) and maintain the distance between the substrate and the image sensor (16c). Between the metasurface layer (14c) and the imager (16c) is disposed a distance (15c) defining the back-focal length formed by the combination of the substrate thickness ($t_{sub}$) and a spacer height ($t_{spacer}$). The spacers (30) can be either fixed to the image sensor (16c) and substrate layer (24c), leading to a fixed distance for ($t_{spacer}$) or the substrate can be placed into a standard optical barrel and ($t_{spacer}$) can be adjustable post assembly. Such embodiments allow for the surface (34) of the substrate (24c) proximal to the image sensor (16c) to remain unpatterned, allowing for the direct integration of an optional optical filter thereon.

Figure 6:
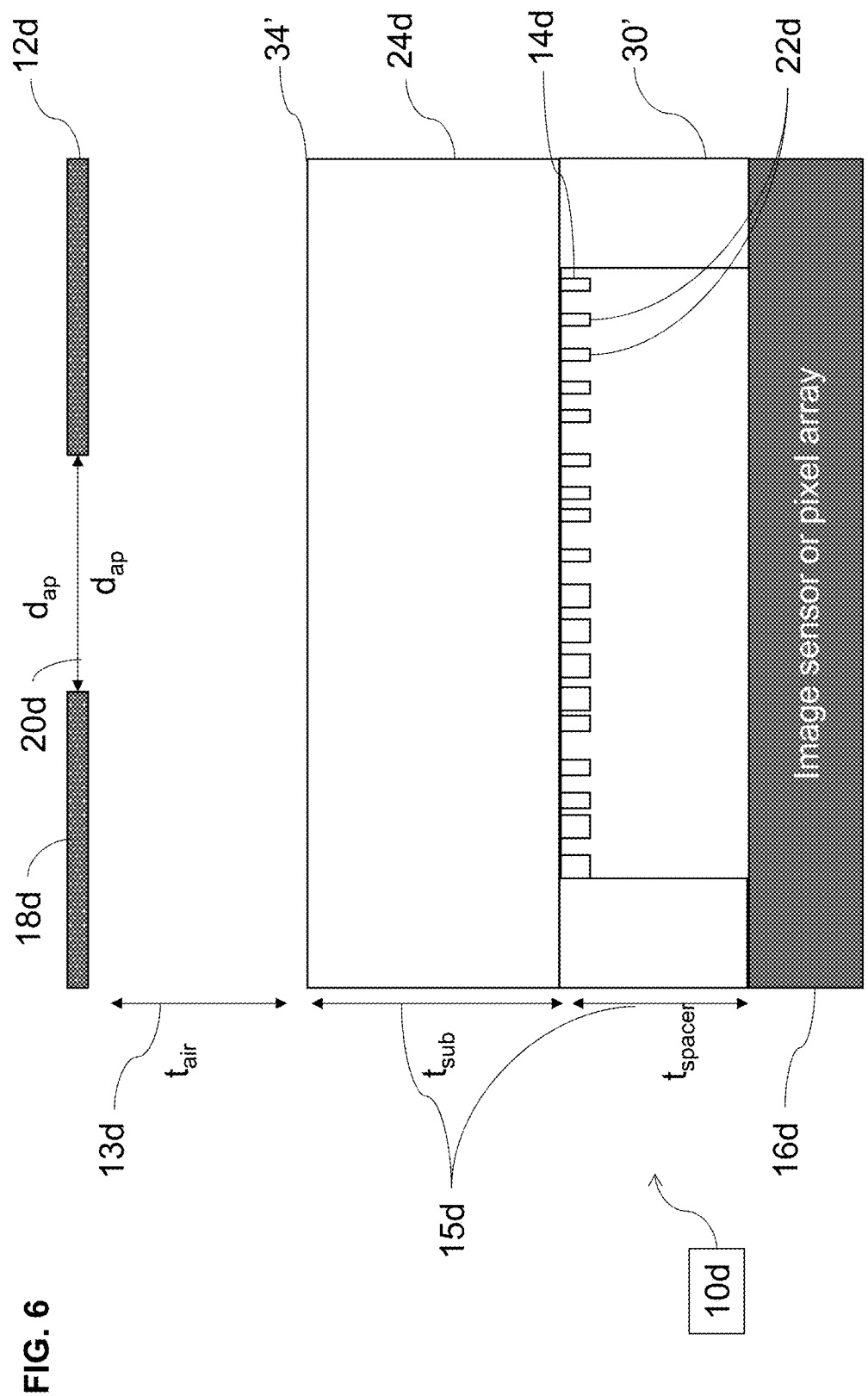
FIG. 6 provides a schematic illustrating an aperture-metasurface imaging system incorporating an air gap above the image sensor and the metasurface layer closer to the image plane in accordance with embodiments of the invention.

Although one embodiment of a configuration of a hybrid aperture/metasurface incorporating an airgap above the image sensor has been described, as shown in FIG. 6, in various embodiments the metasurface layer (14d) may also be disposed on the surface of the substrate (24d) proximal to the image sensor (16d) facing the air gap (32) supported by spacers (30'). Such an implementation allows for the protection of the metasurface elements from environmental contamination. Additionally, such embodiments allow for the surface (34') of the metasurface substrate (24d) distal to the image sensor (16d) to remain unpatterned, allowing for the direct integration of an optional optical filter on the substrate. Again, in such embodiments the spacer (30') can be either fixed to the image sensor (16d) and substrate (24d), leading to a fixed distance for ($t_{spacer}$) or the substrate (24d) can be placed into a standard optical barrel and ($t_{spacer}$) can be adjustable post assembly.

Accordingly, embodiments illustrated in FIGS. 5 and 6 illustrate that the metasurface elements may be arranged to face inward or outward with respect to the air gap between the substrate and image sensor. Production of the metasurface system illustrated in FIGS. 5 and 6 can follow processes described, for example, in U.S. patent application Ser. No. 16/120,174. The spacer layers may be any low-index material, e.g., polymer, $SiO_2$, glass.

Figure 7:
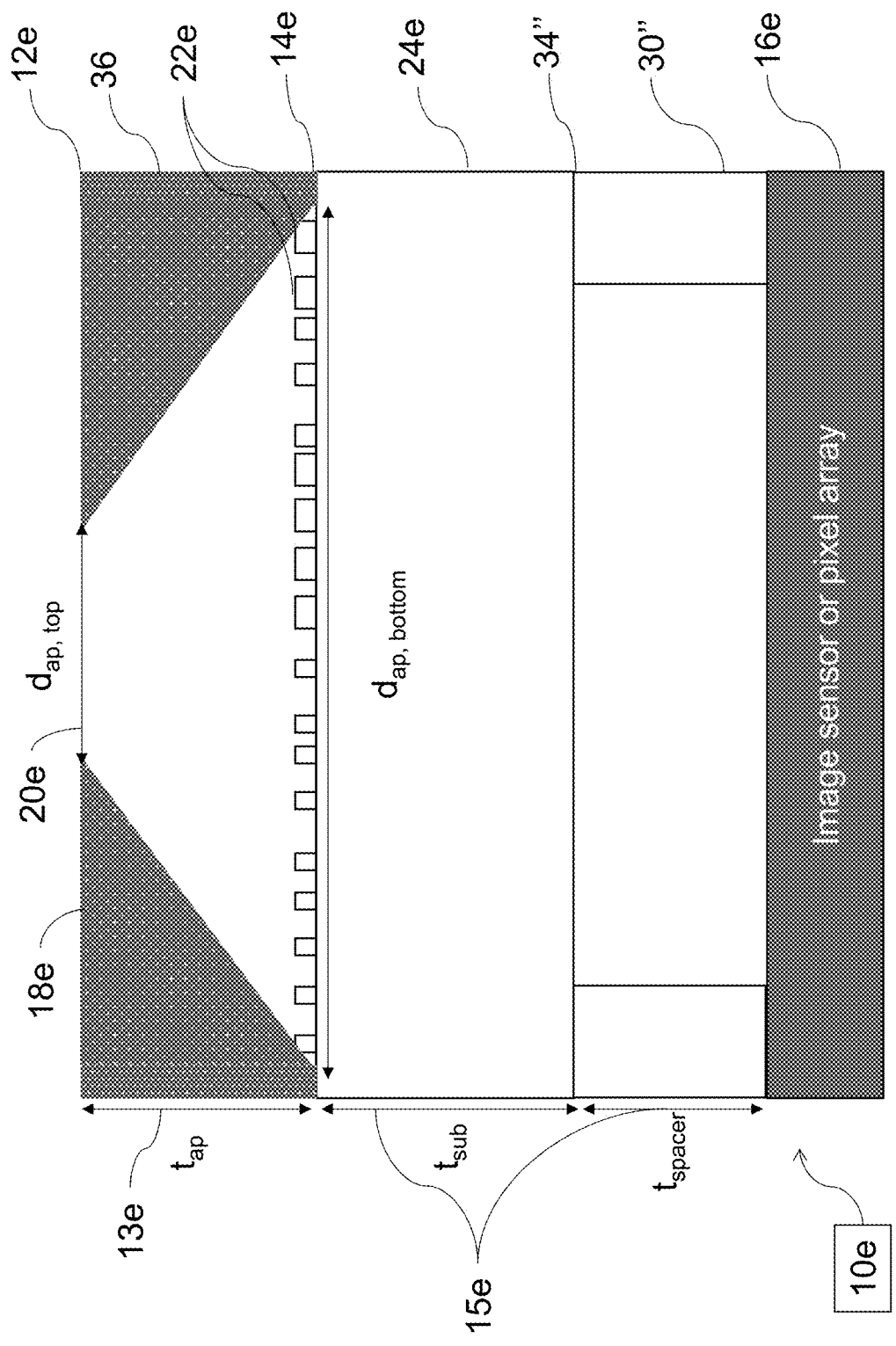
FIG. 7 provides a schematic illustrating an aperture-metasurface imaging system incorporating an air gap above the image sensor and spacers between the aperture and the metasurface in accordance with embodiments of the invention.

Although embodiments of hybrid aperture/metasurface imaging systems incorporating an airgap between the aperture and metasurface substrate have been shown in FIGS. 3, 5 and 6, these embodiments would require a separate supporting structure to secure the aperture and ensure the aperture distance ($t_{air}$) remains constant. However, the aperture structure (12e) may also be attached directly to the substrate layer (24e). An exemplary embodiment of such an imaging system is illustrated in FIG. 7. As shown, in this exemplary embodiment the top aperture (12e) has an aperture body (36) with width $d_{ap,top}$ that sets the entrance aperture of the system, has an aperture offset from the substrate by a distance ($t_{ap}$), and that is angled with a minimum angle set by the half field of view of the imaging system to a width of the aperture after a distance along the optical axis set by ($t_{ap}$) is set by the width of the metasurface layer and is given by ($d_{ap,bottom}$). Although the embodiment shown in FIG. 7 depicts a system in which the metasurface layer (14e) is disposed on a surface of the substrate (24e) distal from the image sensor (16e), it will be understood that the metasurface layer may also be disposed on the surface (34") of the substrate proximal to the image sensor. In addition, it will be understood that while the exemplary embodiment incorporates a spacer structure (30") and airgap between the substrate (24e) and image sensor (16e), embodiments may omit this element and mount the substrate directly atop the image sensor.

An attribute of embodiments of such telecentric designs is that the metasurface imaging system provides a more uniform illumination at the image sensor (referred to by those in the art as "relative illumination"). A data plot of relative illumination for an exemplary system according to embodiments is provided in FIG. 8A, and demonstrates that relative illumination for the aperture/metasurface imaging system is maintained at 100% across the entire field of view, which is a substantial improvement over conventional systems, which can have a difference between center and edge of 50% or more. Accordingly, embodiments of imaging systems are able to collect more total illumination across the full field of view. Embodiments of the metasurface system also provide an additional design variation with respect to traditional refractive lens systems. Typical CMOS image sensors (CIS) require a microlens to be associated with each pixel. Because there is a large variation in CRA across a given sensor plane that is inherent to refractive optical systems, the microlens array on the CIS also requires a complex CRA specification. However, in embodiments of metasurface systems as described herein, the CRA of the microlens array may be configured to be a constant 0 degrees across the CIS allowing for greater simplicity in the design and fabrication of the microlens array. Alternatively, in certain implementations the microlens array may be completely removed from the CIS, saving a process step in CIS production. Furthermore, such aperture metasurface systems with 0 CRA allow one to limit a persistent problem in traditional imaging systems known by those in the art as "pixel crosstalk". Traditional refractive systems that send light into the image sensor are prone to light coupling into neighboring pixels, which adds noise to the system.

Figure 8B:
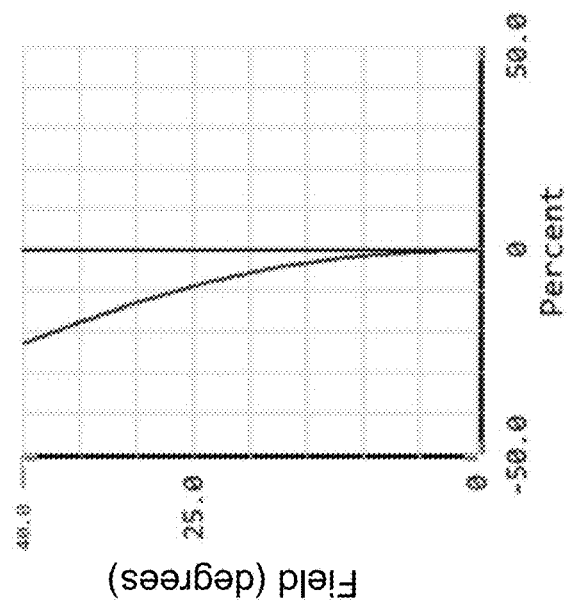
FIG. 8B provides a data graph showing the field of view versus degree of distortion for an aperture-metasurface imaging system in accordance with embodiments of the invention.
Figure 8A:
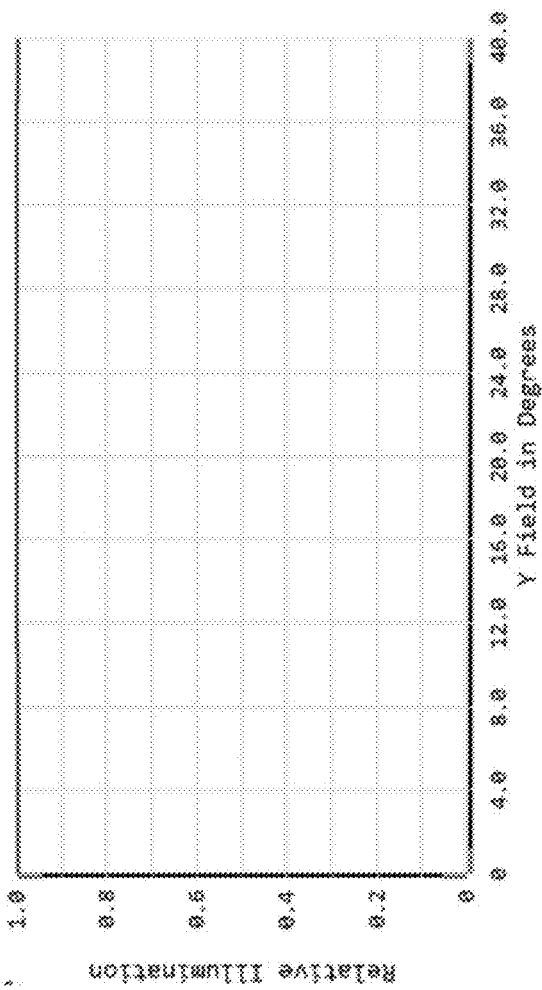
FIG. 8A provides a data graphs showing the relative illumination versus field of view for an aperture-metasurface imaging system in accordance with embodiments of the invention.
Figure 8C:
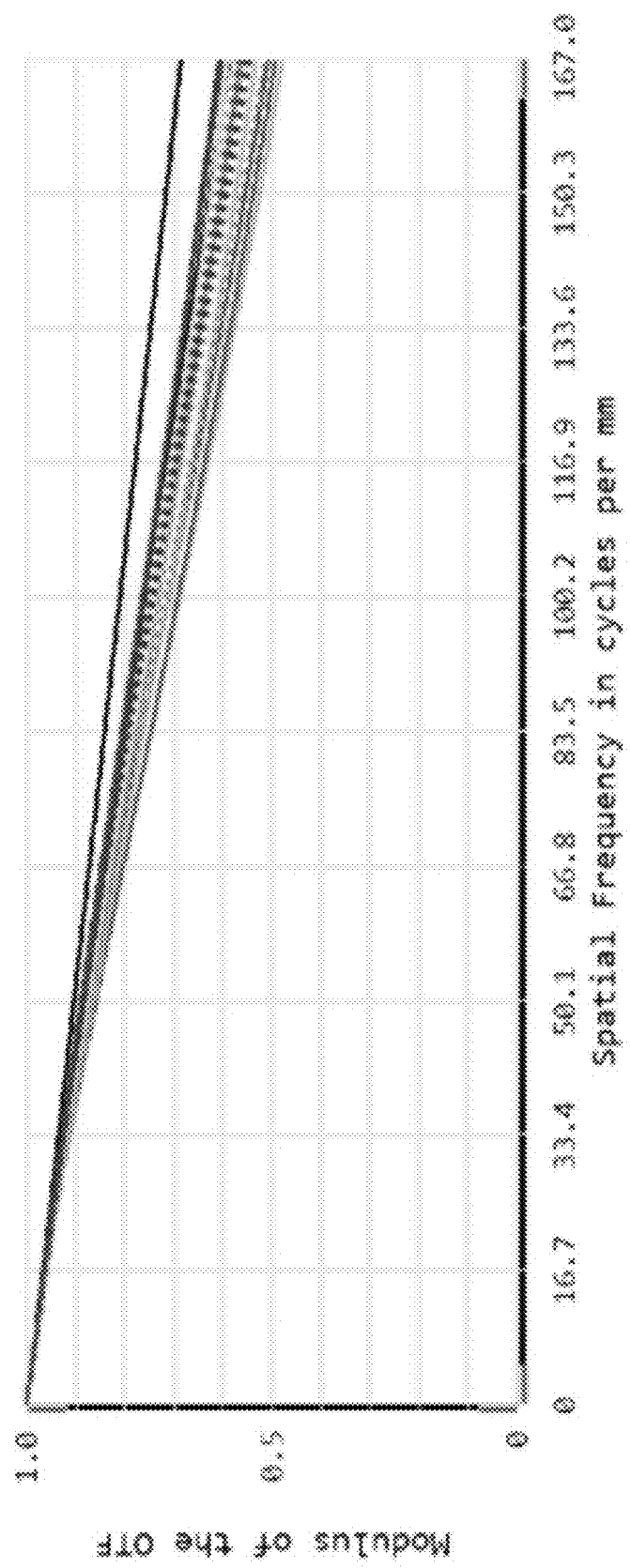
FIG. 8C provides data graphs showing a modulus transfer function over a field of view of 40 degrees for an aperture-metasurface imaging system in accordance with embodiments of the invention.
Figure 8D:
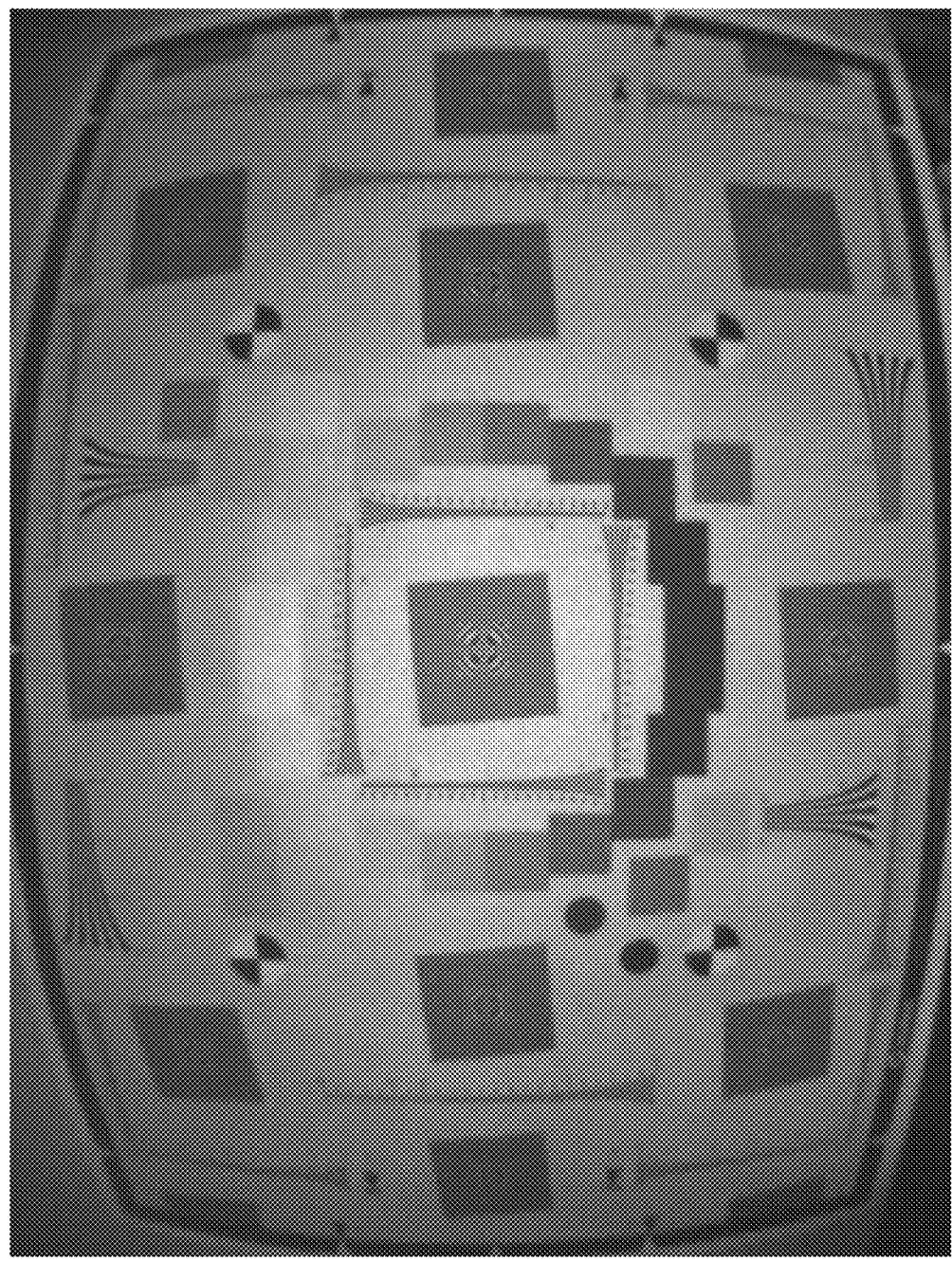
FIG. 8D provides an image of a standard test target taken using an aperture-metasurface imaging system in accordance with embodiments of the invention.

Conventional metasurface systems may be configured with multiple metasurface layers to control for FOV and distortion. The introduction of the additional metasurface element or elements, allow for the realization of a separate arbitrary phase profile, provides more degrees of freedom to control the path of the light rays as compared to a typical system comprised of an equivalent number refractive elements. In embodiments of the current imaging system where a single metasurface layer is used it is not possible to control CRA and correct for grid distortion simultaneously. As a result, a certain amount of grid distortion is inevitable. For example, FIG. 8B provides a data plot illustrating distortion as a function of field at the CMOS image sensor for an imaging system based on the embodiment shown in FIG. 1. FIG. 8C shows a plot of the modulus transfer function over the field of view for an embodiment of an imaging system as shown in FIG. 1. FIG. 8D provides a standard test image illustrating the grid distortion for an imaging system based on the embodiment shown in FIGS. 8A to 8C. As shown, at the edge of the field of view the quality drops off. However, embodiments of the invention show that all of the wavelengths of light are tightly bundled indicating that the distortion can be corrected simply using known image processing software.

Embodiments Implementing Hybrid Refractive and Metasurface Elements

Figure 9:
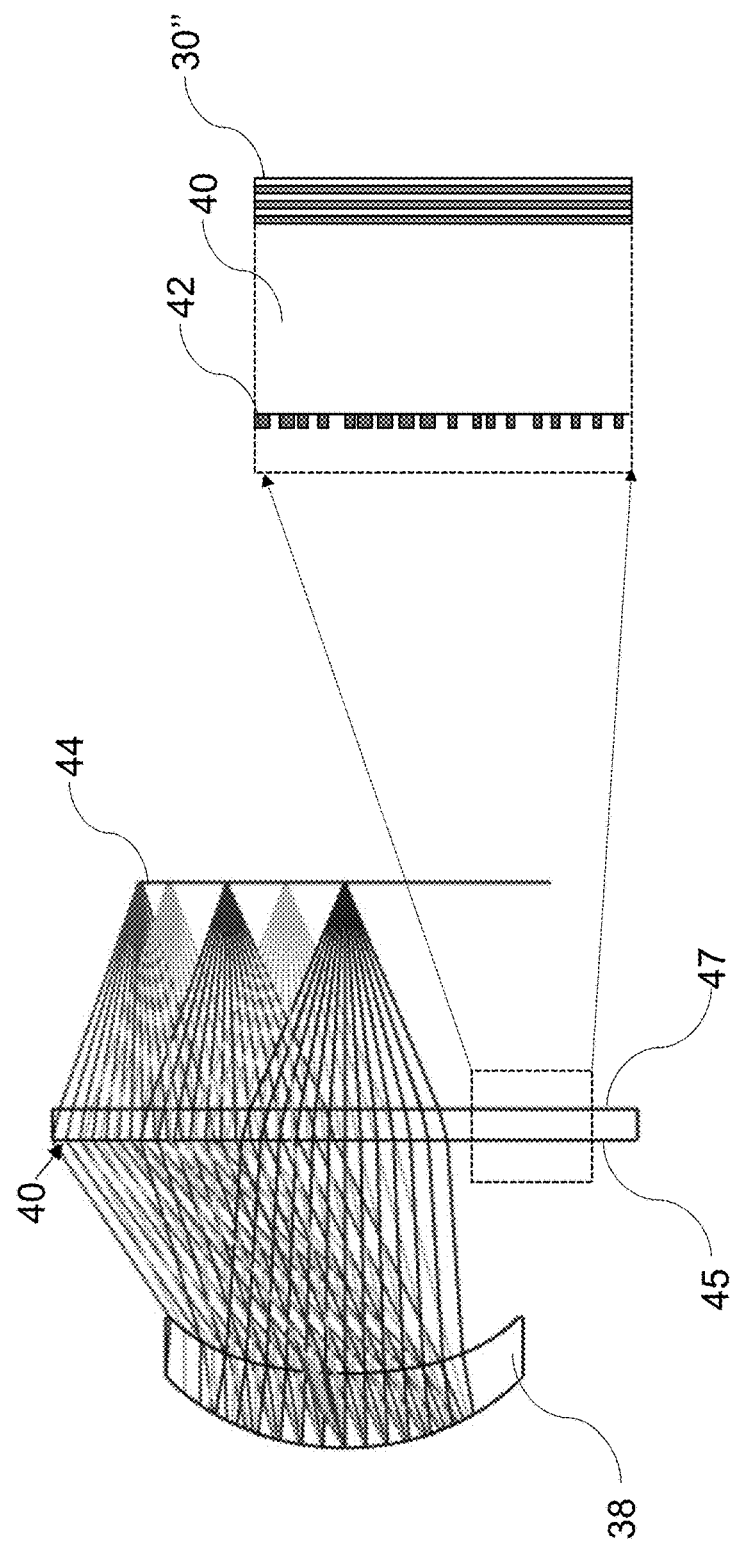
FIG. 9 provides a schematic illustrating a single refractive element and metasurface hybrid imaging system in accordance with embodiments of the invention.

Although embodiments incorporating apertures and single metasurface layers have been described, it will be understood that embodiments are also directed to hybrid systems of metasurface elements incorporating refractive lens elements. FIG. 9 provides a schematic illustration of an implementation of various embodiments of such hybrid refractive lens/metasurface imaging systems. In many embodiments the hybrid imaging surface consists of at least one of each of the following: a refractive lens with one or more surface of curvature and a metasurface layer on a substrate where all of the elements comprising the metasurface are the same height. More generally, the hybrid optical system may be comprised of any number of refractive elements and multiple metasurface layers. In certain embodiments having the metasurface element on the substrate layer that is the final component prior to the image sensor provides the specific advantage of creating a so-called image-space telecentric imaging system. In addition, the substrate upon which the metasurface layer is formed may have a set of filter layers deposited. As described in embodiments incorporating a filter, the metasurface layer is closer to the object plane of the imaging system while the near infrared filter is closer to the image sensor.

An exemplary embodiment of a hybrid refractive element/metasurface imaging system is illustrated in FIG. 9. In many embodiments the system includes at least one refractive optic (38) disposed a set distance away from a substrate layer (40) transparent at the wavelength of interest and having a thickness ($t_{sub}$) having a metasurface layer (42) composed of nanostructures (44) with equal height disposed on a first surface (45) thereof that is distal to the image sensor (46), and an optional optical filter (48) disposed on a second side (47) of the substrate proximal to the imager.

Figure 10B:
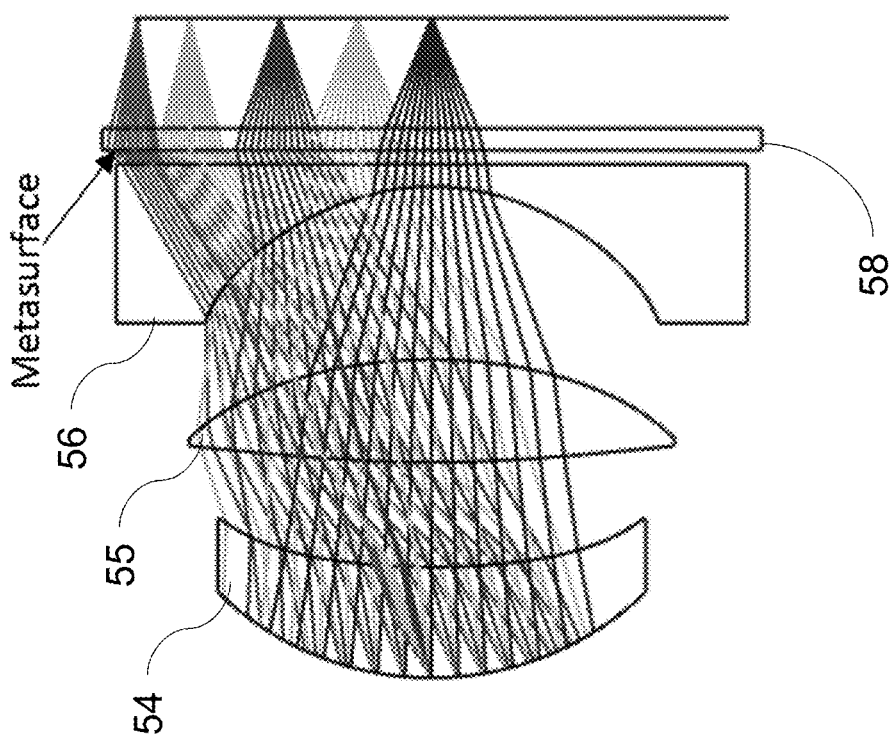
FIGS. 10A and 10B provide schematics illustrating multiple refractive element and metasurface hybrid imaging systems in accordance with embodiments of the invention.
Figure 10A:
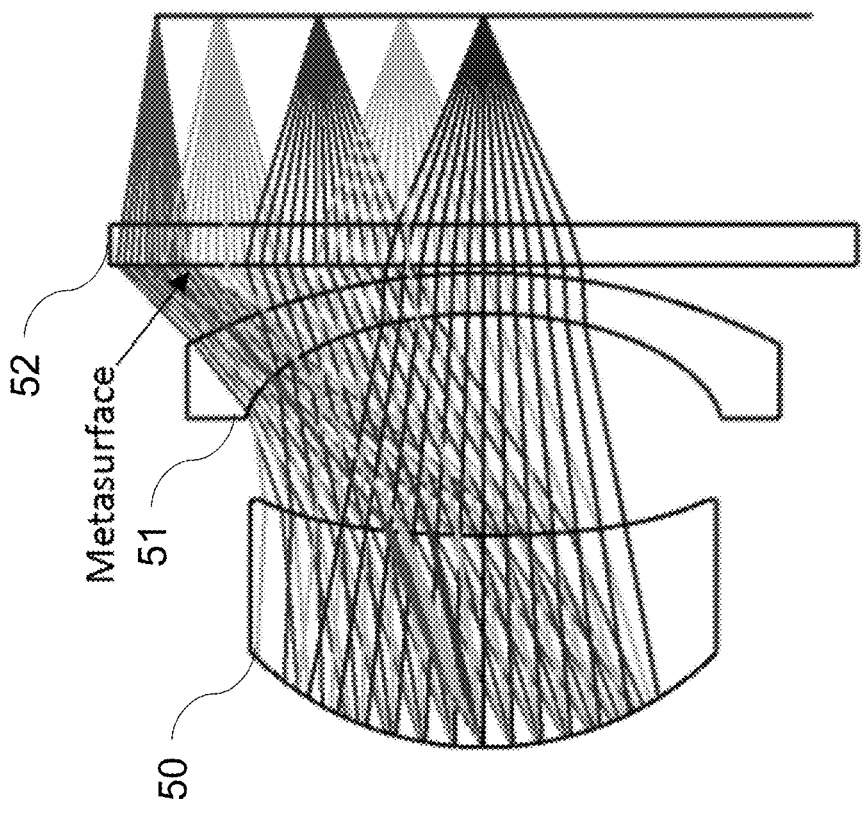

Although the embodiment shown in FIG. 9 illustrates a hybrid system having a single refractive optic and a single metasurface layer, it will be understood that embodiments may also incorporate other arrangements of refractive optics. Figures illustrating such metasurface/refractive hybrid systems are provided in FIGS. 10A and 10B. Specifically, FIG. 10A illustrates a hybrid system comprising two refractive elements (50 & 51) and one metasurface layer (52) system where the two refractive elements are convex-concave and concave-convex. FIG. 10B illustrates a hybrid system comprising three refractive elements (54, 55, 56) and one metasurface element (58) where the three refractive elements are convex-concave, bi-convex and concave-plano, respectively.

With regard to the refractive optical elements in the hybrid systems described above, i.e., those elements preceding the metasurface layer, it will be understood that the surface curvature of these elements may take on any positive, negative or infinite values. Accordingly, although specific arrangements of refractive elements are shown in the figures, the refractive elements may take any suitable form and combination for the specific application, including for example, plano-convex, convex-plano, bi-convex, bi-concave, plano-concave, or concave-plano.

Embodiments Implementing Image Sensor Wafers

Imaging systems known in the art typically consist exclusively of traditional refractive lenses (glass or plastic materials with at least one curved surface). According to embodiments a single metasurface layer is disposed in combination with one or more, curved refractive lens. Surprisingly, it has been found that the inclusion of the single metasurface layer turns the optical system telecentric. Specifically, in many such embodiments, the inclusion of the metasurface element as the final element before the image plane makes the system telecentric.

Embodiments of metasurface layers may be integrated with the CMOS image sensor (CIS) as the cover glass and filter while the refractive optics can be assembled in barrels as is done conventionally in optical imaging modules. In certain embodiments the glass upon which the metasurface layer is fabricated, in addition to be a cover glass for the CIS, can have been previously deposited with dielectric layers and act as a near infrared bandpass or long pass filter. Such embodiments provide a single component with function in the optical imaging process as well as to eliminate unwanted wavelengths from being incident on the image sensor.

Figure 11B:
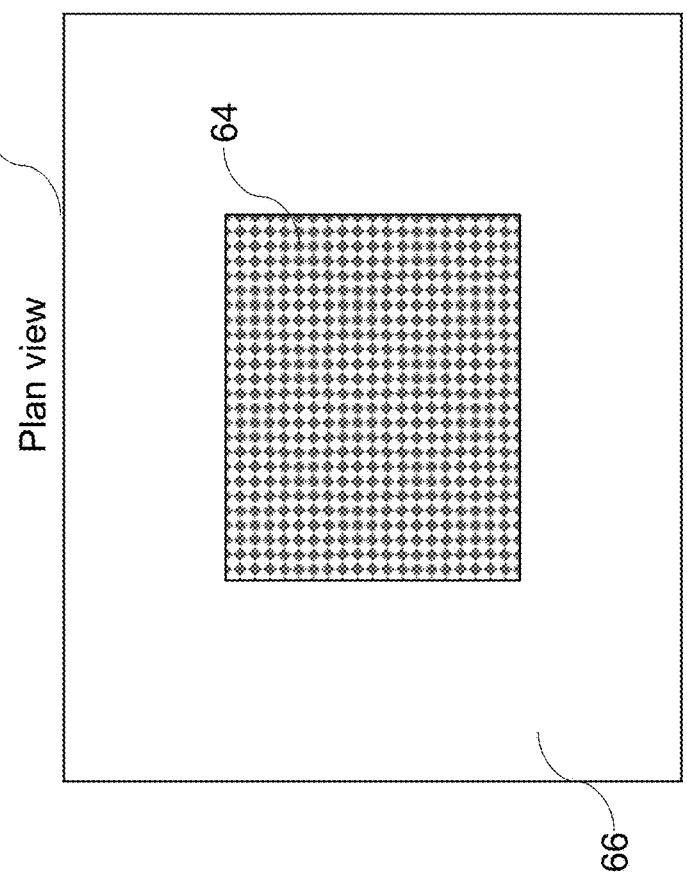
FIG. 11B provides a schematic of an image sensor die in accordance with embodiments of the invention.
Figure 11A:
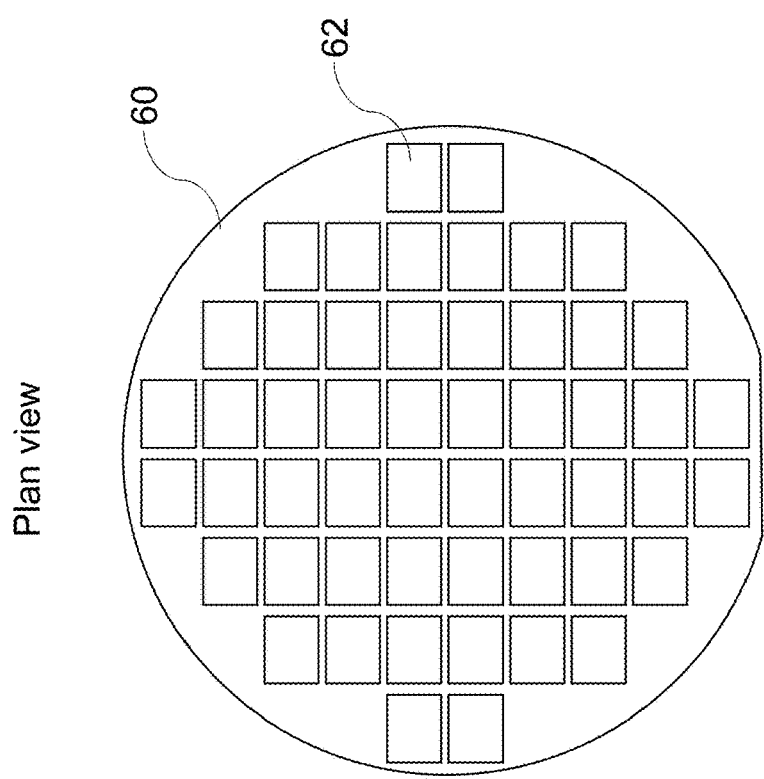
FIG. 11A provides a schematic of an image sensor wafer in accordance with embodiments of the invention.

While the above embodiments have focused on hybrid metasurface imaging systems with a single sensor element, e.g., as shown in FIGS. 1 to 10B, metasurface elements can also be integrated with an image sensor wafer containing a plurality of image sensor dies. A figure illustrating a schematic for an image sensor wafer is shown in FIG. 11A. As shown, embodiments may comprise an image sensor wafer (60) comprising a set of image sensor dies (62), while this is shown in a periodically spaced 2D array, it will be understood that the array need not be periodically spaced. As shown in FIG. 11B, in turn, each sensor die (62) comprises an image sensor active area (64). Although each image sensor may be identical, in many embodiments the character of each sensor may be generally unique. Because each imager comprising array may have unique properties, it may also be advantageous to have an array of metasurface elements, each with uniquely designed properties.

Figure 12B:
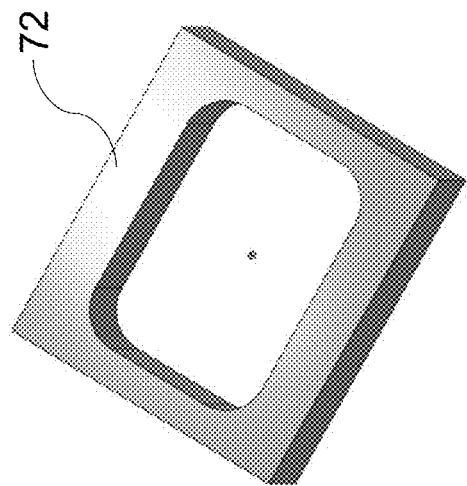
FIG. 12B provides a schematic of a spacer in accordance with embodiments of the invention.
Figure 12A:
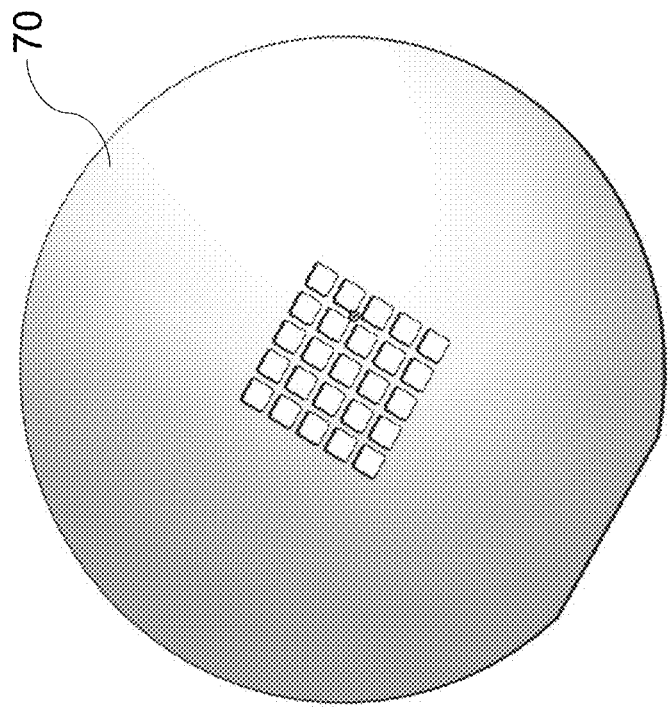
FIG. 12A provides a schematic of a spacer wafer in accordance with embodiments of the invention.

It will be understood that only the active area (64) need be available for imaging. The region outside of the image sensor active area (66) may be used to attach lenses or spacers. Moreover, in various embodiments the metasurface substrate may be offset from the image array by a spacer. Exemplary embodiments of a spacer wafer (70) comprising a plurality of spacer openings suitable for attachment to a sensor wafer, and a spacer die (72) suitable for attachment to an image sensor or lens die are illustrated in FIGS. 12A and 12B, respectively. The design and thickness of the spacer layer will depend on the specific configuration, but in many embodiments the thickness is configured to allow the light from the illumination sources to diverge sufficiently before interacting with image sensor. Again, the function of each metasurface element in the array may be generally unique, and may be patterned on top of each individual image sensor in the array, utilizing any suitable technique outlined for example in U.S. patent application Ser. No. 16/120,174. For example, a metasurface may be fabricated directly on each individual image sensor in the array or a suitable dielectric spacer may be deposited on the image sensor followed by the integration of the metasurface on top of the combined dielectric layer and image sensor. In such embodiments, the metasurfaces may provide a particular radiation pattern for each image sensor and the entire system (image sensor properties, geometrical parameters and metasurface-enabled radiation pattern) can be iteratively optimized for a specific set of performance parameters.

In various other embodiments, a dielectric material, with an index of refraction lower than that of the constituent image sensor material may be deposited and planarized such that a single metasurface can be patterned on top of the dielectric material. This contrasts with embodiments where each image sensor in the array has a unique metasurface patterned on its facet. Again, in such embodiments the combined system may be optimized to achieve a desired performance. Finally, in all of the above embodiments, integration of a metasurface with an image sensor array may be accomplished using wafer level optics processes. In such embodiments, the spacer layer may be air rather than a solid dielectric, illustrations of exemplary embodiments of such devices are shown in FIGS. 13 and 14.

Figure 13:
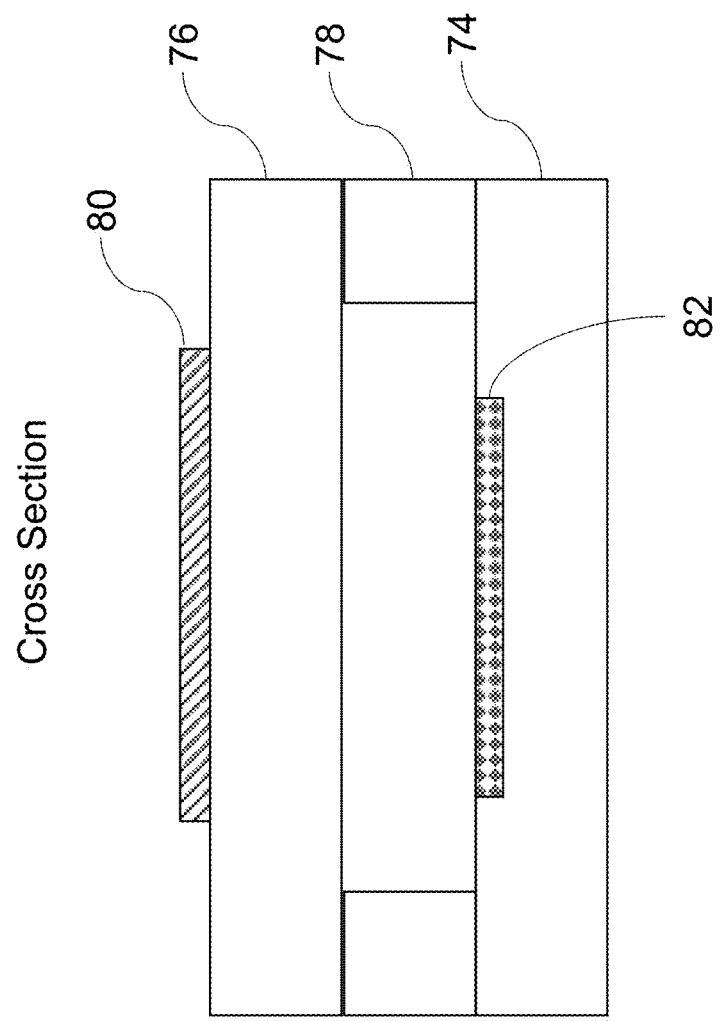
FIG. 13 provides a schematic illustrating an integrated hybrid imaging system incorporating refractive elements with metasurface elements and spacers in accordance with embodiments of the invention.

Specifically, FIG. 13 shows a schematic of an embodiment comprising an image sensor die (74) and a lens die (76) separated by a spacer (78). In such embodiments, the spacer (78) controls the distance between the metasurface area (80) and the image sensor active area (82). The spacer in such embodiments can be attached to the image sensor die or image sensor wafer then the lens can be attached to the spacer. Alternatively the spacer can be first attached to the lens, then the sensor attached to the spacer. In such embodiments, the spacer can be attached using adhesives (e.g. UV-cured epoxy or thermal cured epoxy), solders, or fusion bond.

Figure 14:
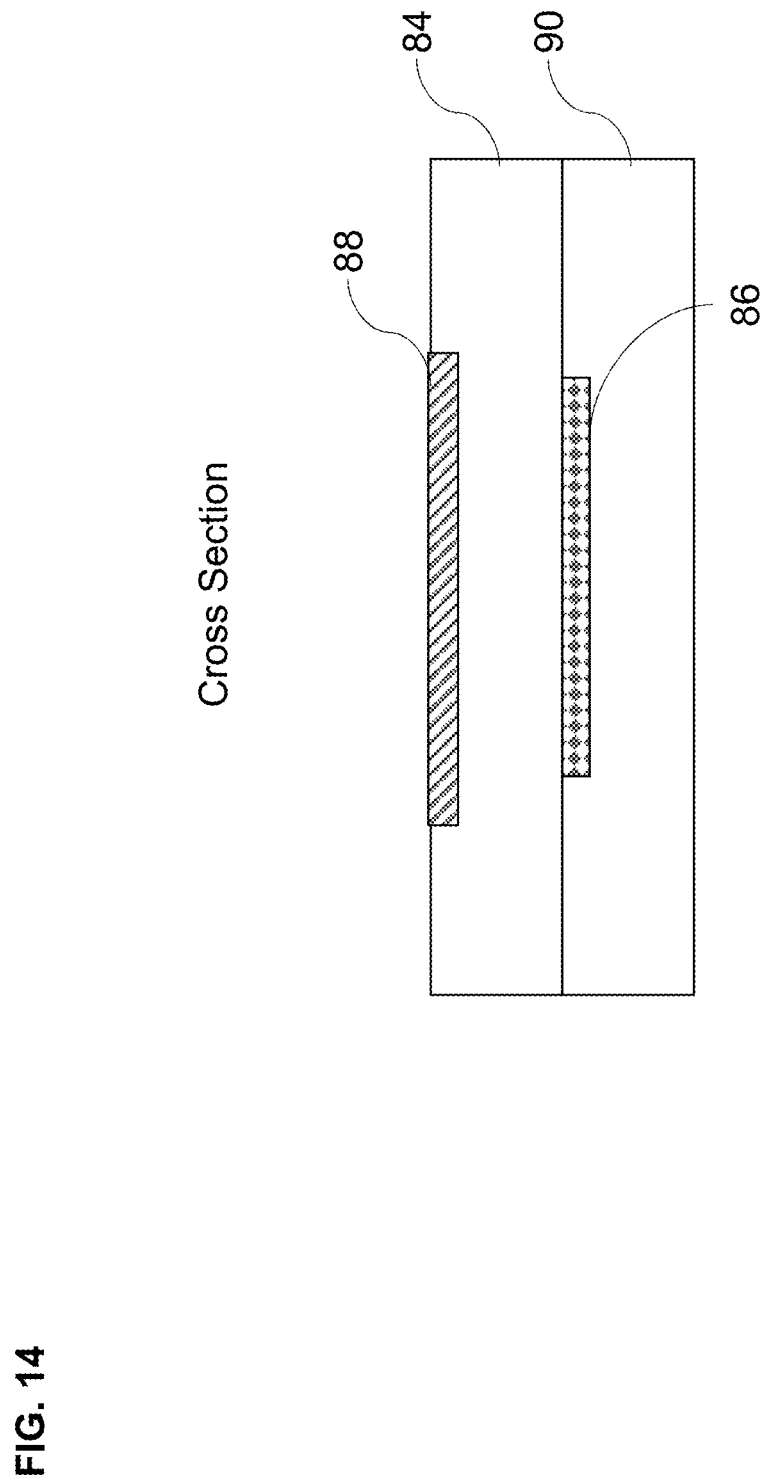
FIG. 14 provides a schematic illustrating an integrated hybrid imaging system incorporating refractive elements with metasurface elements in accordance with embodiments of the invention.

FIG. 14, illustrates and exemplary embodiment that excludes a spacer. In such embodiments, the thickness of the lens die (84) determines the distance between the image sensor active area (86) and the metasurface area (88). The image sensor die (90) and lens die (84) can be directly attached, using adhesive, solder, fusion bond, bump bond, etc. Alternatively the image sensor wafer and lens wafer can be attached directly at the wafer level as previously described.

Figure 15:
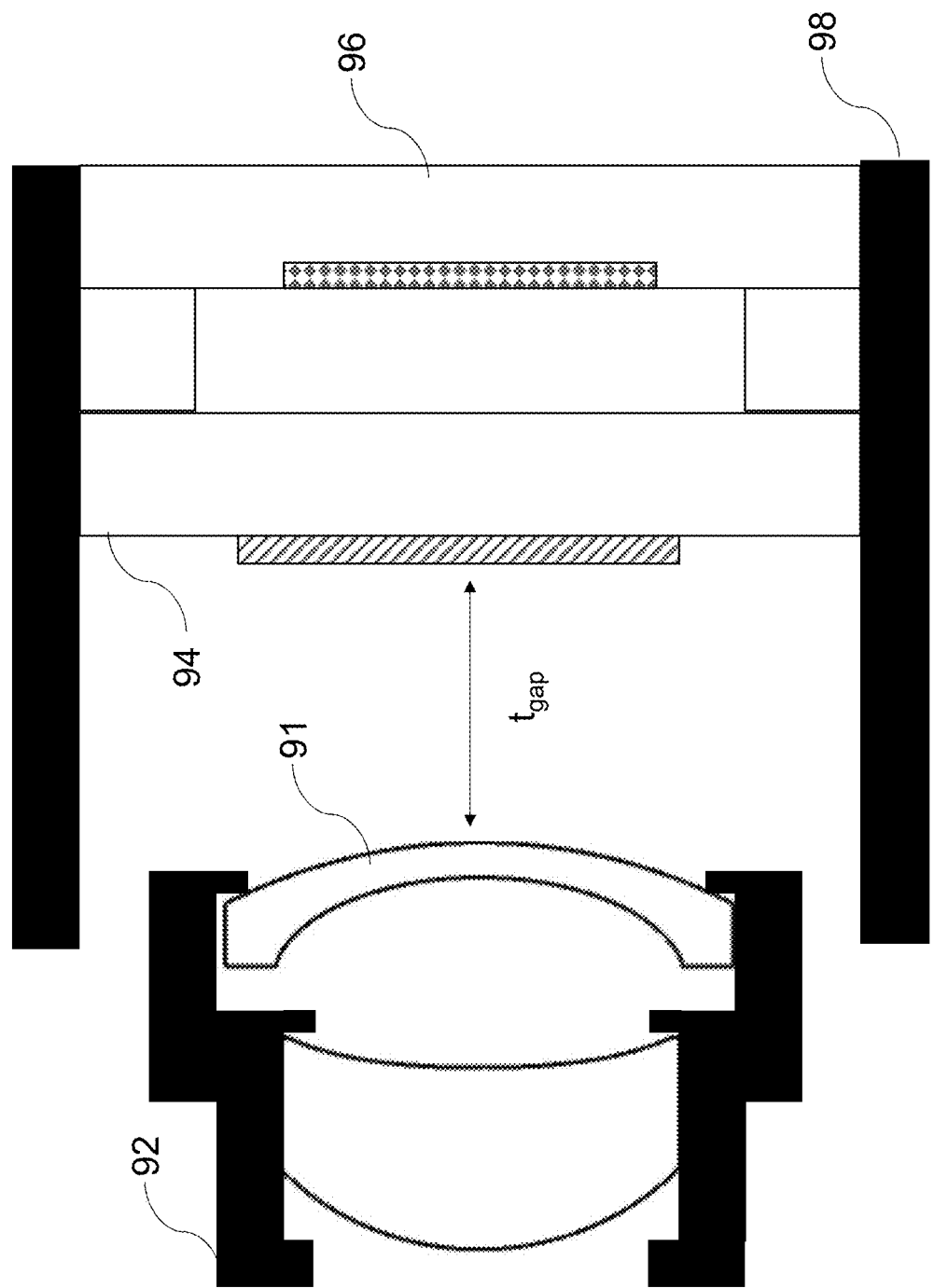
FIG. 15 provides a schematic illustrating a fabrication process for a hybrid refractive element and metasurface imaging system in accordance with embodiments of the invention.

As shown in FIG. 15, in certain embodiments, the refractive lenses (91) of hybrid systems may first be assembled in a lens barrel (92), as is already known in the art. The metasurface element (94) can then be combined with the CMOS image sensor element (96) as described above with respect to FIGS. 13 and 14, above. These two sub components are then assembled together to form the final system. In such embodiments, the refractive lenses may be configured to thread into a housing (98) such that the distance between the refractive elements and metasurface ($t_{gap}$) may be adjusted.

Embodiments Implementing

As is well known in the arts, the image of a scene formed by a circular, radially-symmetric lens or system of circular, radially symmetric lenses will also be a circle. As a result, the geometry of the formed image is often referred to as the image circle of the lens. In modern photography, however, the medium recording the image (CMOS image sensor, e.g.) often has a rectangular shape. In the camera design, the image circle of the lens is designed such that the diameter of the image circle, $D_{image}$, is at least as large as the diagonal of the image sensor, d. However, since the image sensor is rectangular, only a portion of the image circle falls actually falls onto the image sensor. Thus, much of the lens area where light from a scene is incident is not used in the final formation of an image from the camera system.

In a traditional injection molded plastic refractive lens, the shape of the lens is kept ideally circular. The circular shape is used because from a manufacturing perspective circular shapes and radially-symmetric lenses are the easiest to achieve and most repeatable in production. Furthermore, there is minimal cost increase of making a circular lens with larger area rather than a rectangular lens with a smaller area. Thus, conventional cameras use circular lenses and only a portion of the light impinging upon the full circular lens is collected by the rectangular image sensor. These portions of the circular lens where light is incident but does not contribute to light falling on the image sensor are not used in the final image formation.

For the metasurface lenses according to various embodiments, the shape of the lens can be engineered such that the image it forms is uniquely matched with a specific image sensor dimension. In contrast to conventional refractive lenses, in many such embodiments, the lens shape is configured to be no longer circular and the lens to no longer form an image circle. In various embodiments the metasurface lens is formed in a rectangular configuration with specific dimensions and thus the formed scene image is also rectangular. In the ideal case of such a design embodiment, all of the light impinging on the rectangular metasurface lens falls onto the image sensor. Embodiments of metasurfaces having rectangular lenses break the radial symmetry and therefore the image that the lens forms is no longer circular or radially symmetric.

Accordingly, in many embodiments of lens systems the metasurface lens element may be formed in a rectangular configuration. Advantages of such rectangular or not circular lenses include: limiting the total area of the lens, eliminating portions of the lens that would otherwise have light impinge upon it that does not subsequently form an image on the image sensor, and simplifying post processing of lens wafers. Particular embodiments of rectangular metasurface lenses and the imaging systems are described here.

Many embodiments of metasurface lens systems having non-circular configurations have the following commonalities: an entrance aperture which is the stop of the lens system and a metasurface lens which is the final, active optical surface before the image sensor plane. In such embodiments, the entrance aperture (and optical stop) can be circular in cross-section, as it would be in a traditional optical system, while the metasurface lens can be patterned as a rectangle or other arbitrary shape.

Figure 16:
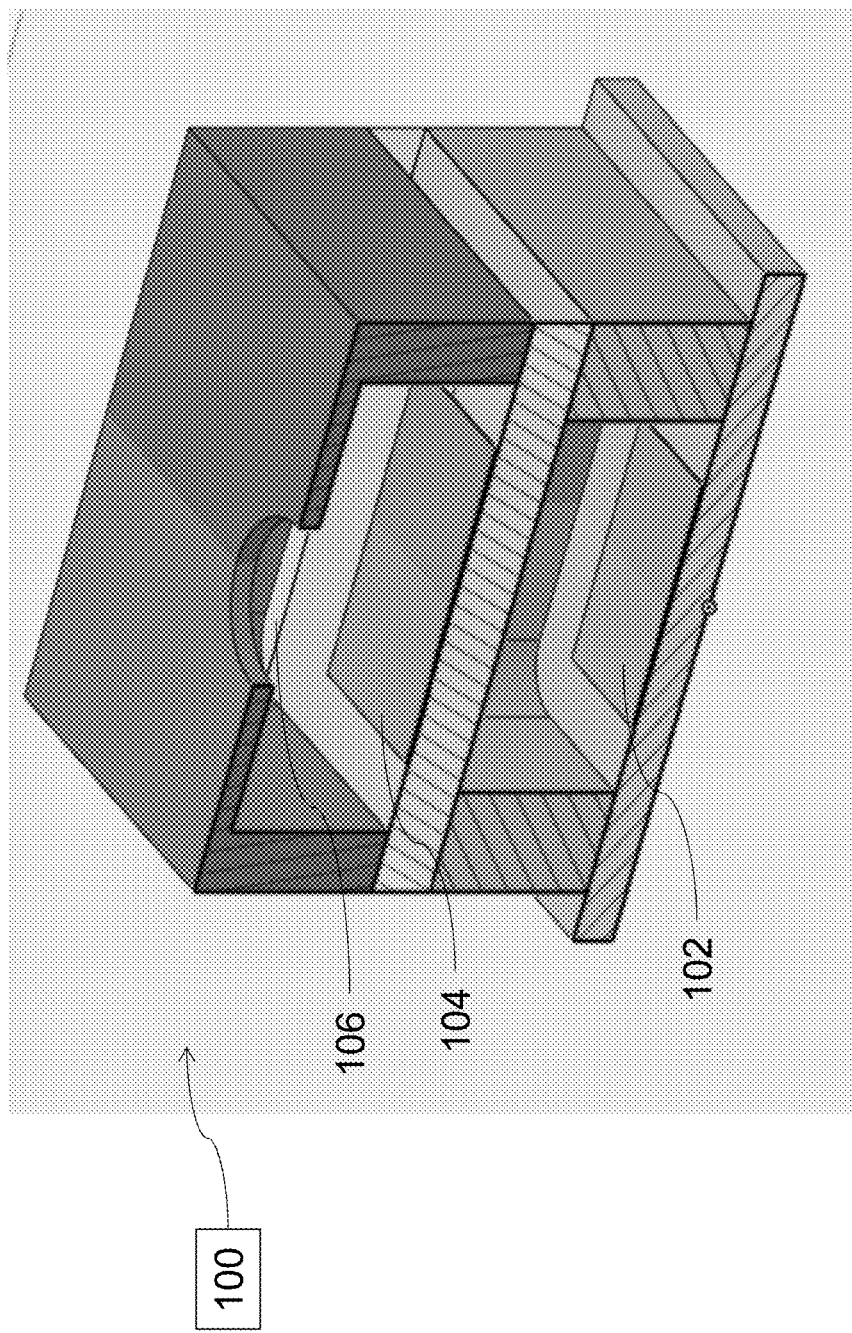
FIG. 16 provides a schematic illustrating an imaging system incorporating a rectangular metasurface lens element in accordance with embodiments of the invention.

FIG. 16 provides an illustration of an exemplary embodiment of a clear aperture metasurface, where the imaging system (100) is comprised of a rectangular image sensor (102) offset from a single rectangular metasurface (104), and a circular entrance aperture (106) offset from the rectangular metasurface lens (104). In embodiments implementing hybrid metasurface refractive systems, the optical systems are comprised of an entrance aperture, at least one refractive lens and a metasurface lens which is the last optical lens element in the system before the image sensor. In these embodiments of such hybrid systems the entrance aperture and the at least one refractive lens can still have a circular or radially symmetric cross section. Thus, embodiments of such hybrid systems would be comprised of a circular aperture (106) offset from at least one circular refractive lens (not shown) which is then offset from the rectangular metasurface lens (104), as shown in FIG. 16. Again, in such embodiments the metasurface lens has rectangular dimensions which are configured to match a specific image sensor. Although example here describe implementations where the metasurface lens element alone has a rectangular cross section, this need not be a limiting case. For example, the entrance aperture (and stop of the optical system) could also be rectangular or the at least one refractive lens could also be rectangular as long as at least the metasurface lens element, which is the last lens element before the image sensor, has a rectangular cross section.

Figure 17A:
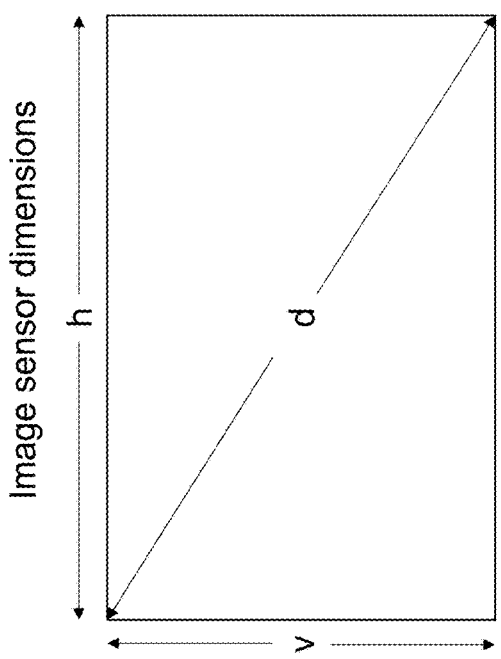
FIGS. 17A and 17B provide schematics illustrating the relative dimensions of an imaging sense (FIG. 17A) and a rectangular metasurface lens element (FIG. 17B) in accordance with embodiments of the invention.
Figure 17B:
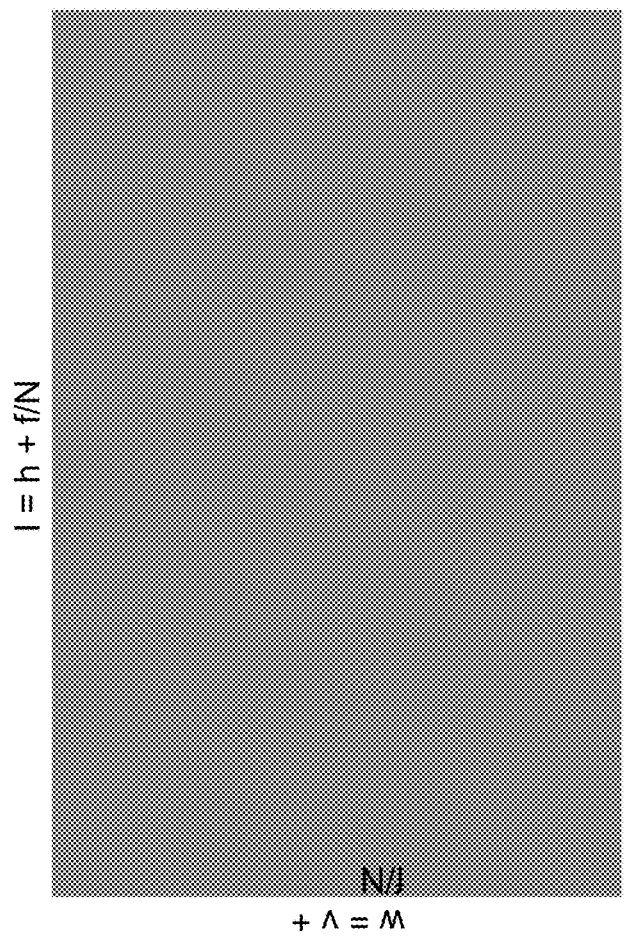

In certain cases, the dimensions of the rectangular lens in the system can be fully characterized by the dimensions of the image sensor in the system and the specifications of the lens. Specifically, as shown in FIG. 17A, an image sensor is characterized by its vertical and horizontal dimensions, v and h, respectively. A lens system is characterized most generally by the f-number of the lens, N, defined as N=f/D where f is the focal length of the optical system and D is the diameter of the lens. Accordingly, as shown in FIG. 17B, the desired rectangular metalense lens width can be shown to be w=v+f/N and the length can be shown to be l=h+f/N. Such definitions of the lens dimensions will result in an image that almost perfectly fills the sensor geometry. In practice, it is desirable to have the image formed by the imaging system be slightly larger than the image sensor dimensions. This oversizing of the image allows for greater tolerance in the final assembly of the lens system. A typical oversizing range may be to take the nominal rectangular lens dimension, as given above, and increase each dimension by 40 microns.

Figure 18B:
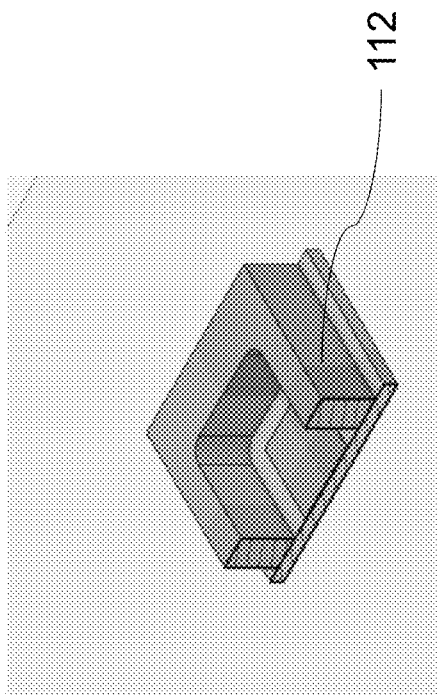
FIGS. 18A to 18D provide schematics illustrating optical systems of a N number of apertures over N number of rectangular lenses over a single image sensor in accordance with embodiments of the invention.
Figure 18A:
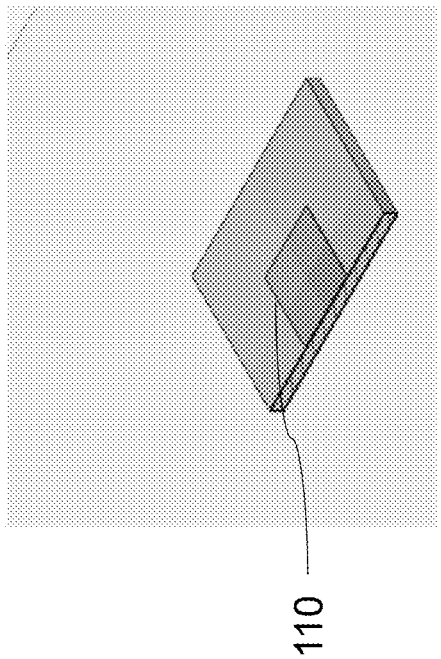
Figure 18D:
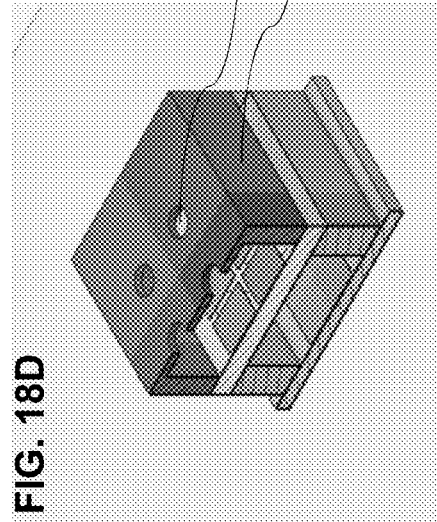
Figure 18C:
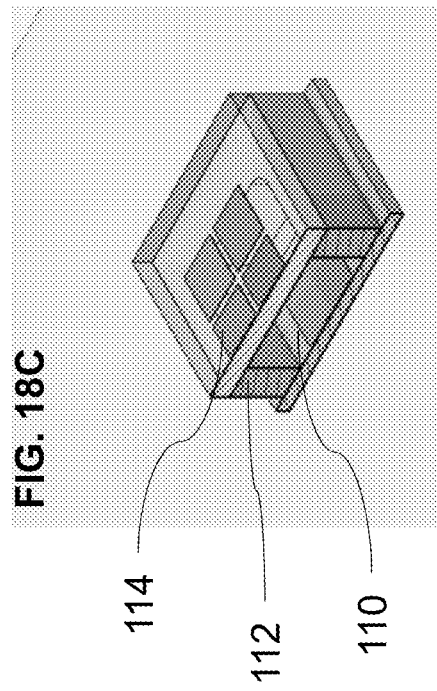

While the above example specifies a single circle aperture coupled with a rectangular lens, in other embodiments an optical system of a N number of apertures over N number of rectangular lenses over a single image sensor may also be provided. For example, the circular apertures and rectangular metasurface lenses may be arrayed in an 2×2 grid over a single image sensor. An example of such a system is shown in FIGS. 18A to 18B. FIG. 18A shows a single image sensor die (110) around which a single spacer (112) can be placed as shown in FIG. 18B. The spacer sets the distance between the rectangular metasurfaces (114), shown in FIG. 18C and the image sensor (110). The last element in the assembly contains a set of circular apertures (116) disposed in association with an additional spacing layer (118) to set the distance between the rectangular metasurface and the circular aperture. A cut away of the full assembly is shown in FIG. 18D.

Although FIG. 18A to FIG. 18D exemplify a 2×2 array of circular apertures over a rectangular metasurface, in general, the grid of circular apertures and rectangular metasurface lenses may be arrayed in any fashion, either symmetric or asymmetric, e.g., 3×3 or 5×2. Additionally, each individual rectangular metasurface and circular aperture comprising the system may have unique dimensions relative to the other aperture metasurface pairs in the system. For example, each aperture diameter in the array can generally be unique or each rectangular lens may be unique. However, the distance between the metasurface lens and the image sensor and the metasurface lens and the circular apertures is generally fixed for the entire system. Changing the mechanical parameters, e.g., aperture size, for each individual component of the array allows the optical properties of each camera in the array to be unique. For example, according to embodiments each sub camera can have a unique f/#, field-of-view, resolution, etc.

DOCTRINE OF EQUIVALENTS

Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. An imaging system comprising:
at least one image sensor;
a substrate layer having a substrate thickness, the substrate layer configured to be transparent to a target wavelength of light, the substrate layer having a first surface distal the at least one image sensor and a second surface proximal with the at least one image sensor;
a spacer layer creating an airgap between the second surface of the substrate and the image sensor; and
a metasurface comprising a single layer of a plurality of identical or unique nanostructured elements disposed on one of either the first or second surfaces, such that light passes through at least a portion of the nanostructured elements such that an angular deflection is imposed thereby,
wherein the metasurface is configured to gather light of a specified operational bandwidth across a specified field of view and shift incoming light such that it focuses on the at least one image sensor at a zero or near-zero degree chief ray angle,
wherein the image sensor and the metasurface have rectangular geometries in plan view, and
wherein the rectangular metasurface is configured to create a rectangular image of the specified field of view onto the rectangular image sensor.

2. The imaging system of claim 1, wherein the metasurface is disposed on the first surface.

3. The imaging system of claim 2, further comprising a narrow bandwidth optical filter disposed on the second surface between the nanostructured elements and the at least one image sensor.

4. The imaging system of claim 2, wherein the image sensor is in contact with the spacer layer.

5. The imaging system of claim 1, wherein the metasurface is disposed on the second surface.

6. The imaging system of claim 1, wherein the field of view is at least ±30 degrees.

7. An imaging system comprising:
at least one image sensor;
a substrate layer having a substrate thickness, the substrate layer configured to be transparent to a target wavelength of light, the substrate layer having a first surface distal the at least one image sensor and a second surface proximal with the at least one image sensor;
at least one refractive lens disposed above the substrate and configured to focus impinging light on the first surface of the substrate layer; and
a single layer of a plurality of identical or unique nanostructured elements comprising a metasurface disposed on one of either the first or second surfaces, such that light impinging on the at least one refractive lens passes through at least a portion of the nanostructured elements such that an angular deflection is imposed thereby,
wherein the distance between the at least one refractive lens and the metasurface are separated by a first distance,
wherein the refractive lens and the metasurface are configured to gather light of a specified operational bandwidth across a specified field of view and shift incoming light such that it focuses on the at least one image sensor at a zero or near-zero degree chief ray angle,
wherein at least the imaging sensor and metasurface have rectangular geometries,
wherein the image sensor is characterized by a vertical, v, and a horizontal, h, dimension, and wherein the at least one refractive lens is characterized by a f-number of the at least one refractive lens, N, defined as N=f/D where f is a focal length of the imaging system and D is a diameter of the at least one refractive lens, and
wherein a metasurface width is given by:

$w = v + f/N$, and wherein a metasurface length l is given by:

$l = h + f/N$.

8. The imaging system of claim 7, wherein the at least one refractive lens is selected from the group consisting of plano-convex, convex-plano, bi-convex, bi-concave, plano-concave, or concave-plano.

9. The imaging system of claim 7, wherein at least a portion of at least one of the refractive lens is interconnected with the first surface.

10. The imaging system of claim 7, wherein the at least one refractive lens comprises at least two refractive lenses comprising a convex-concave lens and concave-convex lens.

11. The imaging system of claim 7, wherein the at least one refractive lens comprises at least two refractive lenses comprising a convex-concave lens, a bi-convex lens, and/or a concave-plano lens.

12. The imaging system of claim 7, wherein the at least one refractive lens has a circular geometry.

* * * * *